(12) United States Patent
Cho et al.

(10) Patent No.: US 11,276,350 B2
(45) Date of Patent: Mar. 15, 2022

(54) DISPLAY DEVICE

(71) Applicant: Samsung Display Co., Ltd., Yongin-si (KR)

(72) Inventors: Young Jin Cho, Seoul (KR); Myeong Hee Seo, Hwaseong-si (KR); Yang Wan Kim, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 17/090,564

(22) Filed: Nov. 5, 2020

(65) Prior Publication Data

US 2021/0241696 A1    Aug. 5, 2021

(30) Foreign Application Priority Data

Jan. 30, 2020  (KR) .................. 10-2020-0011184

(51) Int. Cl.
    *G09G 3/3258*   (2016.01)
    *G09G 3/3291*   (2016.01)
    *H01L 27/32*    (2006.01)

(52) U.S. Cl.
    CPC ......... *G09G 3/3258* (2013.01); *G09G 3/3291* (2013.01); *H01L 27/3276* (2013.01); *G09G 2300/0413* (2013.01)

(58) Field of Classification Search
    CPC .. G09G 3/3258; G09G 3/3233; G09G 3/3291; G09G 3/3208; H01L 27/3276; H01L 27/3223
    See application file for complete search history.

(56) References Cited

U.S. PATENT DOCUMENTS

| | | | |
|---|---|---|---|
| 8,344,616 B2 * | 1/2013 | Sim ...................... | G09G 3/3225 |
| | | | 313/505 |
| 9,978,311 B2 * | 5/2018 | Hwang ................ | G09G 3/3258 |
| 10,395,602 B2 * | 8/2019 | Kim .................... | H01L 27/3276 |
| 2018/0331171 A1 * | 11/2018 | Kim .................... | H01L 27/3223 |
| 2021/0202612 A1 * | 7/2021 | Jung .................. | H01L 27/3276 |

FOREIGN PATENT DOCUMENTS

| | | | | |
|---|---|---|---|---|
| KR | 10-1258259 B1 | 4/2013 | | |
| KR | 10-2015-0124922 A | 11/2015 | | |
| KR | 10-1896377 B1 | 9/2018 | | |
| KR | 10-2018-0125084 A | 11/2018 | | |
| KR | 10-2019-0047565 A | 5/2019 | | |
| KR | 1020210086026 A * | 7/2021 | ......... | H01L 27/3262 |

* cited by examiner

*Primary Examiner* — Sardis F Azongha
(74) *Attorney, Agent, or Firm* — Lewis Roca Rothgerber Christie LLP

(57) ABSTRACT

An embodiment provides a display device including: a display area including a plurality of pixels; a dummy area adjacent to an edge of the display area; a reference voltage supplying line in the dummy area and to supply a reference voltage; and a wire area in which a wire to supply a signal applied to the display area is located, wherein a pixel of the plurality of pixels includes a light emitting diode coupled between a driving voltage line to which a driving voltage is to be applied and a common voltage line to which a common voltage is to be applied, and a driving transistor coupled between the driving voltage line and the light emitting diode, and wherein the reference voltage is to be supplied to a first electrode of the driving transistor.

18 Claims, 16 Drawing Sheets

DISPLAY DEVICE

CROSS-REFERENCE TO RELATED APPLICATION

This application claims priority to and the benefit of Korean Patent Application No. 10-2020-0011184, filed on Jan. 30, 2020, the entire content of which is hereby incorporated by reference.

BACKGROUND

1. Field

Embodiments of the present disclosure relates to a display device.

2. Description of the Related Art

An organic light emitting diode (OLED) display device includes two electrodes and an organic light emitting layer interposed therebetween, wherein electrons injected from one electrode and holes injected from another electrode are combined in the organic light emitting layer to generate excitons. The generated excitons are changed (e.g., transition) to a ground state from an excited state, releasing energy to emit light.

Each pixel of the organic light emitting diode display may be coupled to a data line, a driving voltage line, or the like to receive a voltage. When one data line and one driving voltage line are coupled to one pixel, the data line and the driving voltage line may be at opposite sides of most pixels. However, in a case of a pixel at an outermost left side of the organic light emitting diode display, the data line and the driving voltage line may be at a right side thereof, and neither the data line nor the driving voltage line may be at a left side thereof. In addition, in a case of a pixel at an outermost right side of the organic light emitting diode display, the data line and the driving voltage line may be at a left side thereof, and neither the data line nor the driving voltage line may be at a right side thereof. Therefore, parasitic capacitance of pixels at left and right edges of the organic light emitting diode display may be different than parasitic capacitance of a pixel at a central portion, and thus, the pixels at the left and right edges, and the pixels at the central portion, may have a difference in luminance even when driven at the same voltage.

In addition, in order to drive each pixel of the organic light emitting diode display more efficiently, a design thereof becomes more complicated, and as the number of wires to supply a voltage to drive the pixel increases, a bezel becomes large.

The above information disclosed in this Background section is only for enhancement of understanding of the background of the described technology, and therefore it may contain information that does not form the prior art that is already known or generally available to a person of ordinary skill in the art.

SUMMARY

Embodiments provide a display device that may prevent a difference in luminance from occurring, or may reduce a difference in luminance that occurs, at an edge thereof (e.g., compared to a central portion thereof) and that may reduce a bezel.

An embodiment provides a display device including: a display area including a plurality of pixels; a dummy area adjacent to an edge of the display area; a reference voltage supplying line in the dummy area and to supply a reference voltage; and a wire area in which a wire to supply a signal to the display area is located, wherein a pixel of the plurality of pixels includes a light emitting diode coupled between a driving voltage line to which a driving voltage is to be applied and a common voltage line to which a common voltage is to be applied, and a driving transistor coupled between the driving voltage line and the light emitting diode, and wherein the reference voltage is to be supplied to a first electrode of the driving transistor.

The display device may further include an eighth transistor coupled to the first electrode of the driving transistor, and a reference voltage line coupled to a first electrode of the eighth transistor, wherein the reference voltage line may be coupled to the reference voltage supplying line.

The display device may further include a connecting area between the dummy area and the wire area.

The reference voltage line and the reference voltage supplying line may be coupled in the connecting area.

The reference voltage supplying line may have a bar shape extending in a column direction.

The reference voltage supplying line may extend in a column direction and may be bent at least once.

The display device may further include a data line in the display area, and a dummy data line in the dummy area and adjacent to the data line.

The display device may further include a first initializing voltage supplying line in the wire area and to supply a first initializing voltage, a second initializing voltage supplying line in the wire area and to supply a second initializing voltage, a fourth transistor coupled to a gate electrode of the driving transistor, and a seventh transistor coupled to the light emitting diode, wherein the first initializing voltage may be supplied to a first electrode of the fourth transistor, and wherein the second initializing voltage may be supplied to a second electrode of the seventh transistor.

The display device may further include a first initializing voltage line coupled to the first electrode of the fourth transistor, wherein the first initializing voltage line may be coupled to the first initializing voltage supplying line.

The display device may further include a second initializing voltage line coupled to the second electrode of the seventh transistor, wherein the second initializing voltage line may be coupled to the second initializing voltage supplying line.

The display device may further include a first initializing voltage supplying line in the dummy area and to supply a first initializing voltage, and a fourth transistor coupled to a gate electrode of the driving transistor, wherein the first initializing voltage may be supplied to a first electrode of the fourth transistor.

The display device may further include a first initializing voltage line coupled to the first electrode of the fourth transistor, wherein the first initializing voltage line may be coupled to the first initializing voltage supplying line.

The display device may further include a second initializing voltage supplying line in the dummy area and to supply a second initializing voltage, and a seventh transistor coupled to the light emitting diode, wherein the second initializing voltage may be supplied to a second electrode of the seventh transistor.

The display device may further include a second initializing voltage line coupled to the second electrode of the seventh transistor, wherein the second initializing voltage line may be coupled to the second initializing voltage supplying line.

The display device may further include a second initializing voltage supplying line in the dummy area and to supply a second initializing voltage, and a seventh transistor coupled to the light emitting diode, wherein the second initializing voltage may be supplied to a second electrode of the seventh transistor.

The display device may further include a second initializing voltage line coupled to the second electrode of the seventh transistor, wherein the second initializing voltage line may be coupled to the second initializing voltage supplying line.

Another embodiment provides a display device, including: a display area including a plurality of pixels; a dummy area adjacent to an edge of the display area; a first initializing voltage supplying line in the dummy area and to supply a first initializing voltage; and a wire area in which a wire to supply a signal to the display area is located, wherein a pixel of the plurality of pixels may include a light emitting diode coupled between a driving voltage line to which a driving voltage is to be applied and a common voltage line to which a common voltage is to be applied, a driving transistor coupled between the driving voltage line and the light emitting diode, and a fourth transistor coupled to a gate electrode of the driving transistor, and wherein the first initializing voltage may be supplied to a first electrode of the fourth transistor.

The display device may further include a second initializing voltage supplying line in the dummy area and to supply a second initializing voltage, and a seventh transistor coupled to the light emitting diode, wherein the second initializing voltage may be supplied to a second electrode of the seventh transistor.

Another embodiment provides a display device, including: a display area including a plurality of pixels; a dummy area adjacent to an edge of the display area; a second initializing voltage supplying line in the dummy area and to supply a second initializing voltage; and a wire area in which a wire to supply a signal to the display area is located, wherein a pixel of the plurality of pixels may include a light emitting diode coupled between a driving voltage line to which a driving voltage is to be applied and a common voltage line to which a common voltage is to be applied, a driving transistor coupled between the driving voltage line and the light emitting diode, and a seventh transistor coupled to the light emitting diode, and wherein the second initializing voltage may be supplied to a second electrode of the seventh transistor.

The display device may further include a second initializing voltage line coupled to the second electrode of the seventh transistor, wherein the second initializing voltage line may be coupled to the second initializing voltage supplying line.

According to the embodiments, it is possible to prevent a luminance difference from occurring, or to reduce a difference in luminance that occurs, at an edge of a display device and to reduce a bezel thereof.

BRIEF DESCRIPTION OF THE DRAWINGS

The accompanying drawings, together with the specification, illustrate example embodiments of the present invention. These drawings, together with the description, serve to better explain aspects and principles of the present invention.

DETAILED DESCRIPTION

Figure 1:
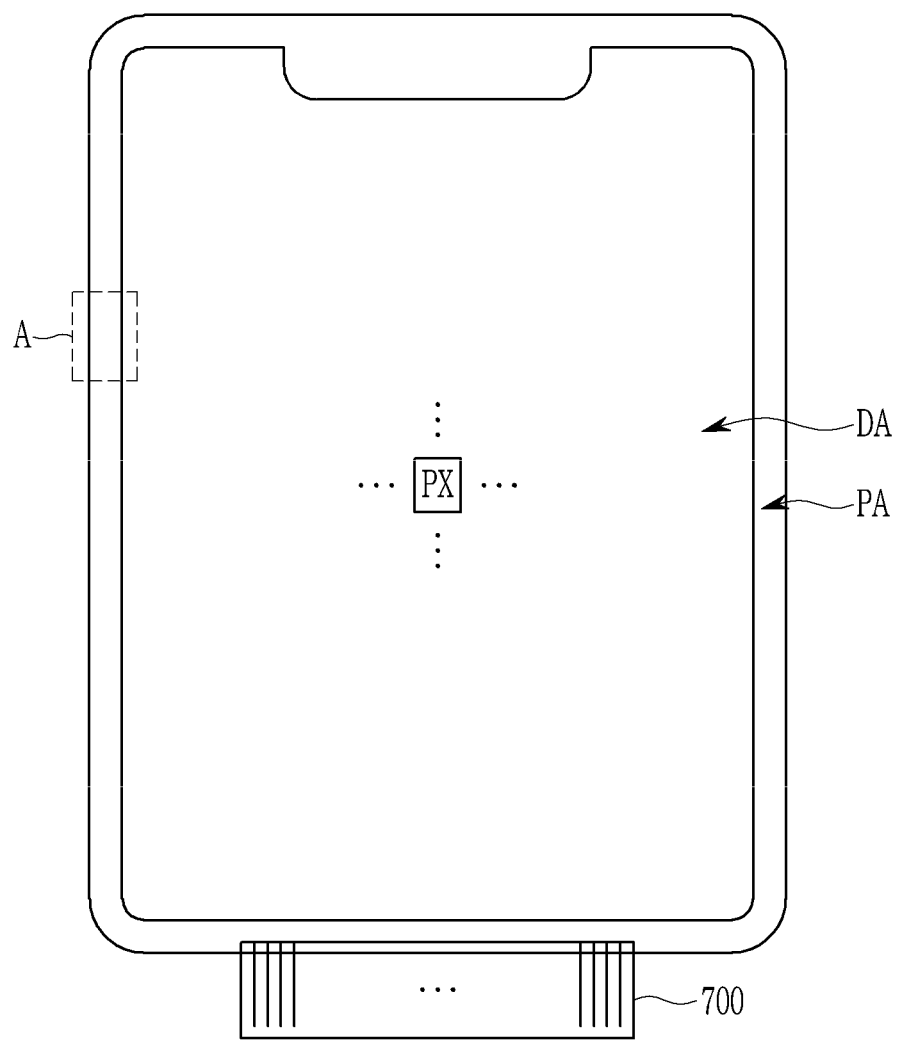
FIG. 1 schematically illustrates a top plan view of a display device according to an embodiment.

The present disclosure will be described more fully hereinafter with reference to the accompanying drawings, in which exemplary embodiments of the present disclosure are shown. As those of ordinary skill in the art would realize, the described embodiments may be modified in various and suitable different ways, all without departing from the spirit or scope of the present disclosure.

Parts (e.g., elements and/or features) that are irrelevant to the description may be omitted to clearly describe the present disclosure, and like reference numerals designate like elements throughout the specification.

Further, in the drawings, the size and thickness of each element may be exaggerated for ease of description, and the present disclosure is not limited by the embodiments illustrated in the drawings. In the drawings, the thicknesses of layers, films, panels, areas, regions, etc., may be exaggerated for clarity. In the drawings, for ease of description, the thicknesses of some layers and areas may be exaggerated. As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure."

It will be understood that when an element such as a layer, film, area, region, or substrate is referred to as being "on" another element, it can be directly on the other element or intervening elements may also be present. In contrast, when an element is referred to as being "directly on" another element, there are no intervening elements present. Further, in the specification, the word "on" or "above" may mean on (e.g., on top of) or below an element, and does not necessarily mean on the upper side of the element based on a gravitational direction.

In addition, unless explicitly described to the contrary, the word "comprise" and variations such as "comprises" or "comprising" will be understood to imply the inclusion of stated elements but not the exclusion of any other elements. As used herein, the term "and/or" includes any and all combinations of one or more of the associated listed items. As used herein, the singular forms "a" and "an" are intended to include the plural forms as well, unless the context clearly indicates otherwise.

Further, throughout the specification, the phrase "in a plan view" or "on a plane" means viewing a target portion from the top, and the phrase "in a cross-section" or "on a cross-section" means viewing a cross-section formed by vertically cutting a target portion from the side.

First, a display device according to an embodiment will be described with reference to FIG. 1 and FIG. 2.

Figure 2:
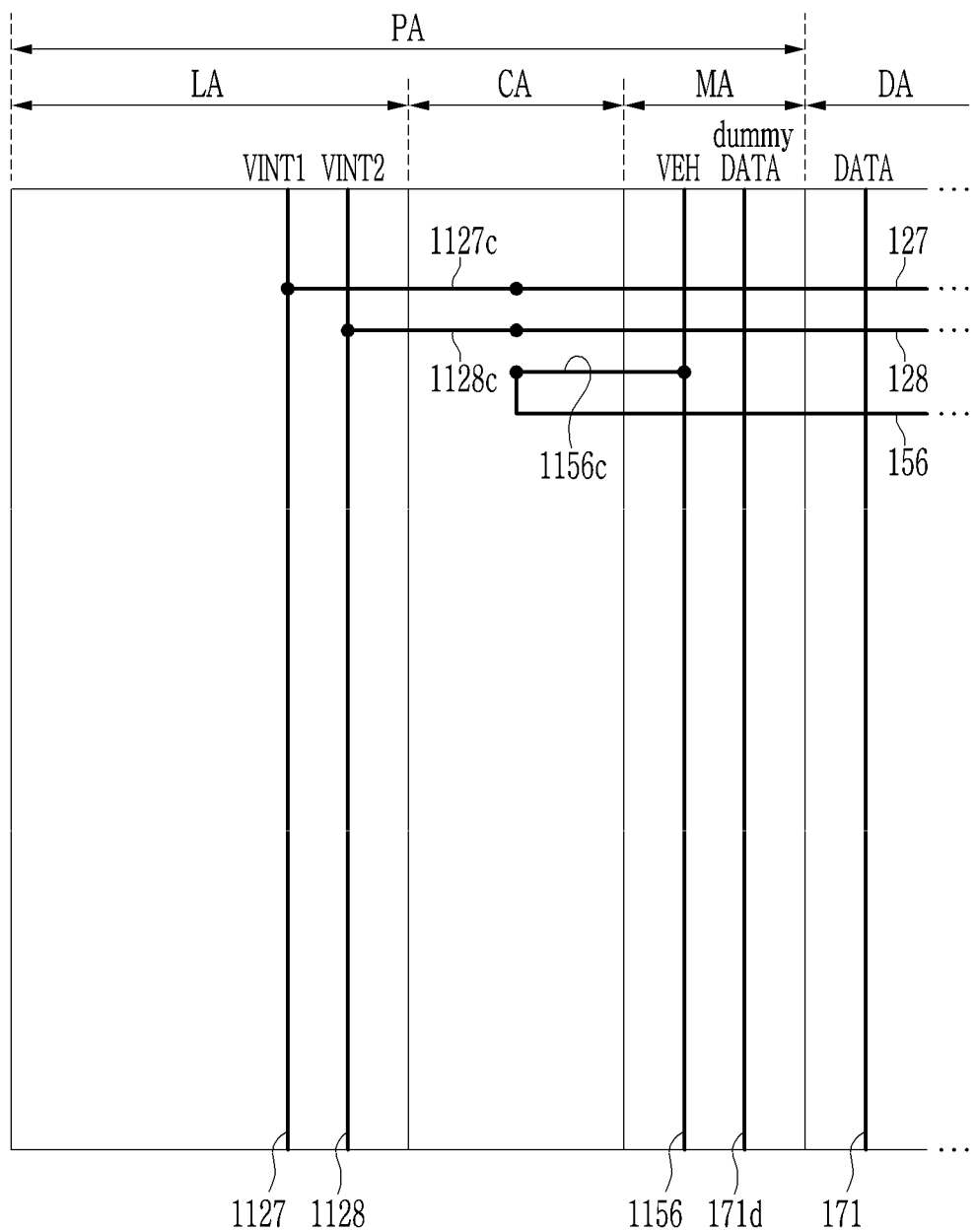
FIG. 2 is a diagram illustrating wires in an area forming portion "A" of FIG. 1 and in respective areas.

FIG. 1 schematically illustrates a top plan view of a display device according to an embodiment, and FIG. 2 is a diagram illustrating wires in an area forming portion "A" of FIG. 1 and in respective areas.

As shown in FIG. 1, a display device 1000 according to an exemplary embodiment includes a display area DA in which a screen is displayed and a peripheral area PA outside the display area DA. The display area DA includes a plurality of pixels PX, and a screen may be displayed according to on/off operations of the plurality of pixels PX. The plurality of pixels PX may be arranged in various suitable forms. The peripheral area PA is an area on which a driving circuit to drive the plurality of pixels PX of the display area DA is mounted. The peripheral area PA may partially or entirely surround the display area DA. For example, the display device 1000 may have a substantially quadrangular shape, and the display area DA may have a quadrangular shape at a substantially central portion of the display device 1000. In this case, a corner portion of the quadrangular shape of the display area DA may have a shape that is curved (e.g., chamfered with a curve). The peripheral area PA may be outside an upper edge, a left edge, a right edge, and a lower edge of the display area DA to surround the display area DA. However, the disclosed shapes and positions of the display area DA and the peripheral area PA are examples, and the present disclosure is not limited thereto, and the shapes and positions of the display area DA and the peripheral area PA may be variously and suitably changed.

A printed circuit board 700 may be at one edge (e.g., the lower edge) of the display device 1000. A circuit for controlling driving of the display device 1000 may be designed on the printed circuit board 700.

As shown in FIG. 2, the display device according to the display device includes the display area DA and the peripheral area PA outside the display area DA. The peripheral area PA includes a dummy area MA adjacent to an edge of the display area DA, a wire area LA in which a wire to supply a signal applied to the display area DA is located, and a connecting area CA between the dummy area MA and the wire area LA. The wire to supply the signal applied to the display area DA may extend in a column direction in the wire area LA, and may extend in a row direction in the display area DA. As such, the wires extending in the column direction and the wires extending in the row direction may be coupled to (e.g., may be coupled to each other at or in) the connecting area CA. Although the connecting area CA has been described as being between the dummy area MA and the wire area LA, the connecting area CA is not limited thereto and may be suitably changed in some cases.

A reference voltage line 156 to which a reference voltage VEH is applied, a first initializing voltage line 127 to which a first initializing voltage VINT1 is applied, a second initializing voltage line 128 to which a second initializing voltage VINT2 is applied, and a data line 171 to which a data voltage DATA is applied may be in the display area DA. A plurality of pixels are in the display area DA, and each pixel may include a plurality of transistors. The transistors of each pixel may be coupled to the reference voltage line 156, the first initializing voltage line 127, the second initializing voltage line 128, and the data line 171. The reference voltage line 156, the first initializing voltage line 127, and the second initializing voltage line 128 may substantially extend in the row direction. The data line 171 may extend in the column direction. However, this is merely an example, and the present disclosure is not limited thereto. In some embodiments, at least one selected from among the reference voltage line 156, the first initializing voltage line 127, and the second initializing voltage line 128 may extend in a direction other than the row direction. In addition, in some embodiments, the data line 171 may extend in the row direction.

The dummy area MA is illustrated as being adjacent to the left edge of the display area DA, but is not limited thereto. The dummy area MA may be adjacent to opposite edges (e.g., to the left and rights edges and/or to the upper and lower edges) of the display area DA. For example, the dummy area MA may be further at the right edge of the display area DA. In this case, the dummy area MA at the right edge of the display area DA may have a symmetrical (e.g., reflectively symmetrical) shape with the dummy area MA at the left edge of the display area DA.

A reference voltage supplying line 1156 to supply the reference voltage VEH and a dummy data line 171d to supply a dummy data voltage (dummy DATA) may be in the dummy area MA. The reference voltage supplying line 1156 and the dummy data line 171d may extend side by side. The reference voltage supplying line 1156 and the dummy data line 171d may substantially extend in the column direction. Although the dummy data line 171d is shown to be between the reference voltage supplying line 1156 and the data line 171, the present disclosure is not limited thereto. For example, the positions of the dummy data line 171d and the reference voltage supplying line 1156 may be changed. For example, the reference voltage supplying line 1156 may be between the dummy data line 171d and the data line 171.

The reference voltage supplying line 1156 may include a first protrusion 1156c branched from the reference voltage supplying line 1156. The reference voltage line 156 in the display area DA may extend to the peripheral area PA, and the reference voltage supplying line 1156 may be coupled to the reference voltage line 156. The first protrusion 1156c of the reference voltage supplying line 1156 may extend from the dummy area MA to the connecting area CA, and the reference voltage line 156 may extend from the display area DA to the connecting area CA. The first protrusion 1156c of the reference voltage supplying line 1156 may be coupled to the reference voltage line 156 in the connecting area CA. However, this is merely an example, and the reference voltage supplying line 1156 and the reference voltage line 156 may be coupled to each other in an area other than the connecting area CA. For example, the reference voltage supplying line 1156 and the reference voltage line 156 may be coupled in the dummy area MA or the display area DA.

A first initializing voltage supplying line 1127 to supply the first initializing voltage VINT1 and a second initializing voltage supplying line 1128 to supply the second initializing voltage VINT2 may be in the wire area LA. The first initializing voltage supplying line 1127 and the second initializing voltage supplying line 1128 may extend side by side. The first initializing voltage supplying line 1127 and the second initializing voltage supplying line 1128 may substantially extend in the column direction. Although it is illustrated that the first initializing voltage supplying line 1127 is at the left side (e.g., the left side of the second initializing voltage supplying line 1128) and the second initializing voltage supplying line 1128 is at the right side (e.g., the right side of the first initializing voltage supplying line 1127), the present disclosure is not limited thereto, and the arrangement of the first initializing voltage supplying line 1127 and the second initializing voltage supplying line 1128 may be variously and suitably changed. In addition, various suitable wires may be in the wire area LA in addition to the first initializing voltage supplying line 1127 and the second initializing voltage supplying line 1128. For example, the wire area LA may further include a wire to supply a scan signal, a wire to supply an inverted scan signal, a wire to supply an initializing control signal, and/or the like.

The first initializing voltage supplying line 1127 may include a second protrusion 1127c branched from the first initializing voltage supplying line 1127. The first initializing voltage line 127 in the display area DA may extend to the peripheral area PA, and the first initializing voltage supplying line 1127 may be coupled to the first initializing voltage line 127. The second protrusion 1127c of the first initializing voltage supplying line 1127 may extend from the wire area LA to the connecting area CA, and the first initializing voltage line 127 may extend from the display area DA to the connecting area CA. The second protrusion 1127c of the first initializing voltage supplying line 1127 may be coupled to the first initializing voltage line 127 in the connecting area CA. However, this is merely an example, and the present disclosure is not limited thereto. For example, the first initializing voltage supplying line 1127 and the first initializing voltage line 127 may be coupled in an area other than the connecting area CA.

The second initializing voltage supplying line 1128 may include a third protrusion 1128c branched from the second initializing voltage supplying line 1128. The second initializing voltage line 128 in the display area DA may extend to the peripheral area PA, and the second initializing voltage supplying line 1128 may be coupled to the second initializing voltage line 128. The third protrusion 1128c of the second initializing voltage supplying line 1128 may extend from the wire area LA to the connecting area CA, and the second initializing voltage line 128 may extend from the display area DA to the connecting area CA. The third protrusion 1128c of the second initializing voltage supplying line 1128 may be coupled to the second initializing voltage line 128 in the connecting area CA. However, this is merely an example, and the present disclosure is not limited thereto. For example, the second initializing voltage supplying line 1128 and the second initializing voltage line 128 may be coupled in an area other than the connecting area CA.

Hereinafter, a connection relationship between the wires of FIG. 3 to FIG. 6 will be further described.

Figure 3:
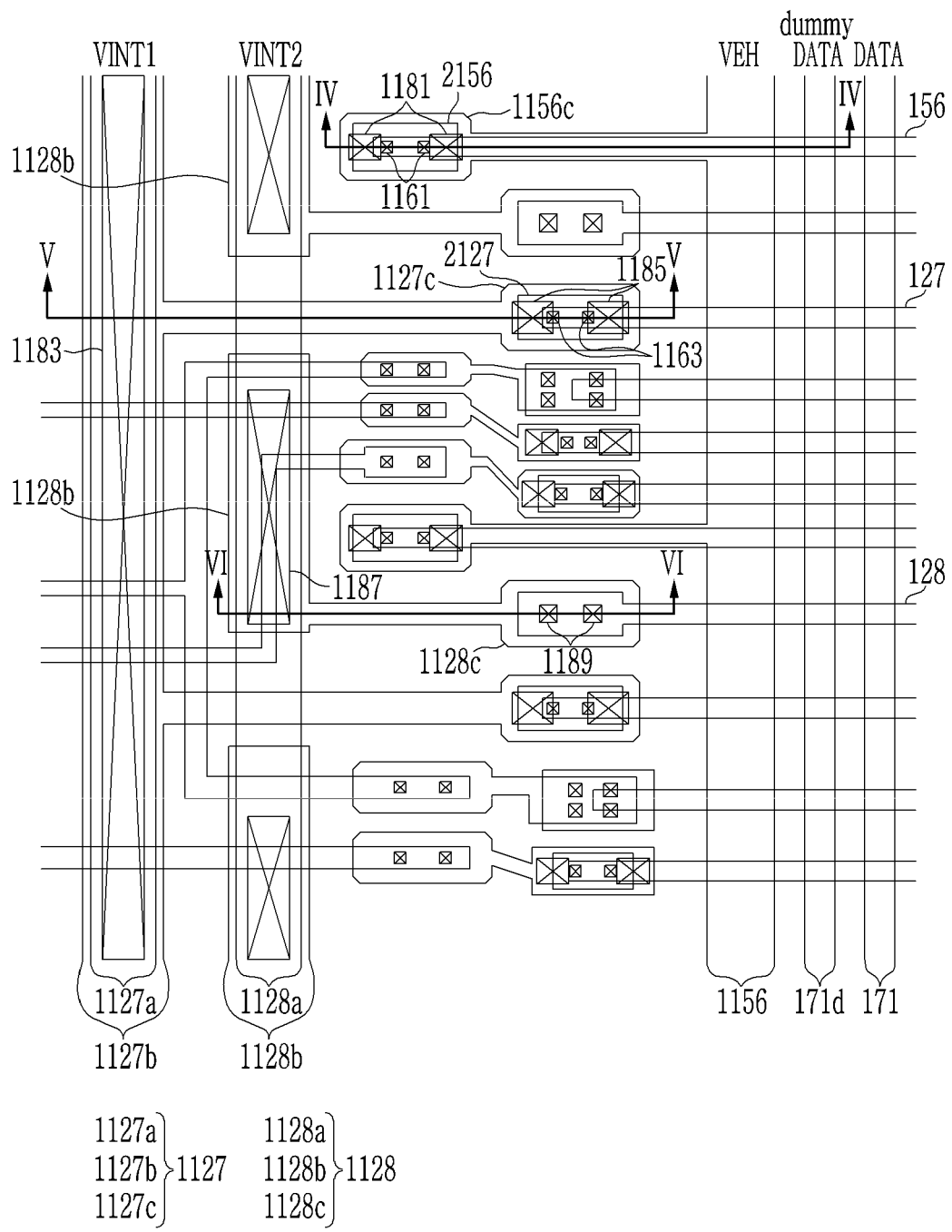
FIG. 3 illustrates a top plan view of a partial area of FIG. 2.
Figure 4:
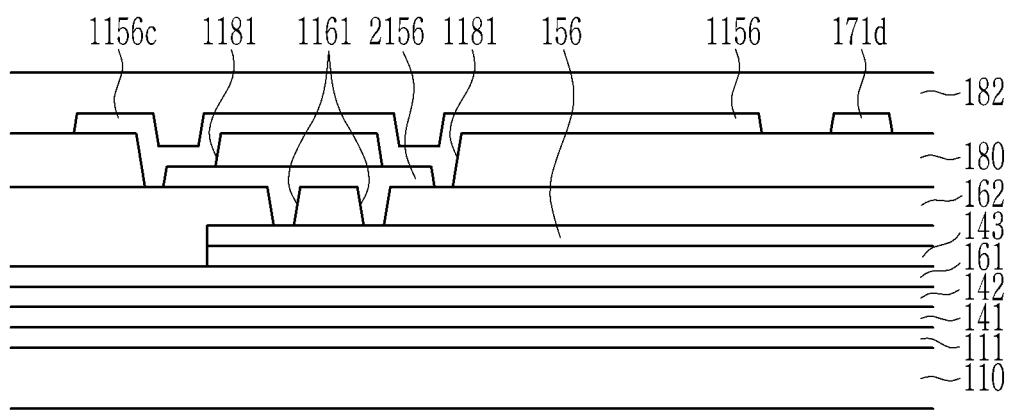
FIG. 4 illustrates a cross-sectional view taken along line IV-IV of FIG. 3.
Figure 5:
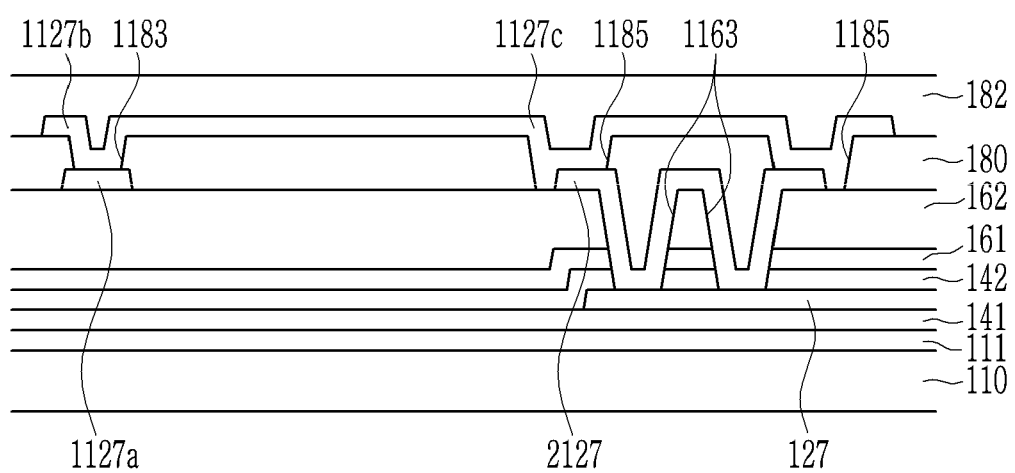
FIG. 5 illustrates a cross-sectional view taken along line V-V of FIG. 3.
Figure 6:
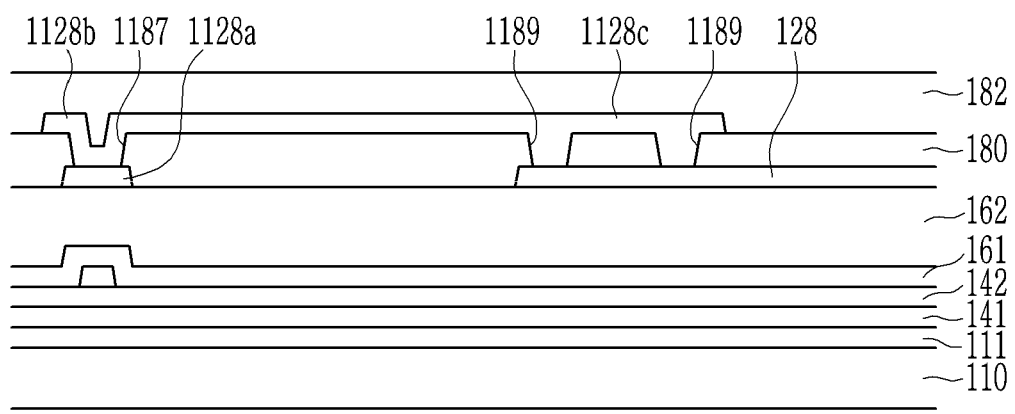
FIG. 6 illustrates a cross-sectional view taken along line VI-VI of FIG. 3.

FIG. 3 illustrates a top plan view of a partial area of FIG. 2, and FIG. 4 illustrates a cross-sectional view taken along line IV-IV of FIG. 3. FIG. 5 illustrates a cross-sectional view taken along line V-V of FIG. 3, and FIG. 6 illustrates a cross-sectional view taken along line VI-VI of FIG. 3.

As shown in FIG. 3 to FIG. 6, the reference voltage supplying line 1156 to supply the reference voltage VEH, the dummy data line 171d to supply the dummy data voltage (dummy DATA), and the data line 171 to which the data voltage DATA is applied, may be adjacent to each other. The reference voltage supplying line 1156, the dummy data line 171d, and the data line 171 may substantially extend in the column direction. In addition, the first initializing voltage supplying line 1127 to supply the first initializing voltage VINT1 and the second initializing voltage supplying line 1128 to supply the second initializing voltage VINT2 may be adjacent to each other. The first initializing voltage supplying line 1127 and the second initializing voltage supplying line 1128 may substantially extend in the column direction.

The reference voltage line 156 that is coupled to the reference voltage supplying line 1156 and to which the reference voltage VEH is applied may substantially extend in the row direction. The first initializing voltage line 127 that is coupled to the first initializing voltage supplying line 1127 and to which the first initializing voltage VINT1 is applied may substantially extend in the row direction. The second initializing voltage line 128 that is coupled to the second initializing voltage supplying line 1128 and to which the second initializing voltage VINT2 is applied may substantially extend in the row direction.

In an area between the second initializing voltage supplying line 1128 and the reference voltage supplying line 1156, one or more of the wires extending in the column direction and one or more of the wires extending in the row direction may be coupled to each other.

First, a connecting portion of the reference voltage supplying line 1156 and the reference voltage line 156 will be described with reference to FIG. 3 and FIG. 4.

A buffer layer 111 may be on a substrate 110. The substrate 110 may include at least one selected from among polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate 110 may include a flexible material that may be bent and/or folded, and it may have a single layer or a multilayer structure.

The buffer layer 111 may have a structure of a single layer or a multilayer. In FIG. 4, the buffer layer 111 is illustrated as a single layer, but the buffer layer 111 may have a multilayer structure in some embodiments. The buffer layer 111 may include an organic insulating material and/or an inorganic insulating material. For example, the buffer layer 111 may include a silicon nitride, a silicon oxide, a silicon oxynitride, and/or the like.

A polycrystalline semiconductor including (e.g., made of) a polycrystalline silicon material may be on the buffer layer 111.

A first gate insulating film 141, a second gate insulating film 142, and a first interlayer insulating film 161 may be stacked on the buffer layer 111. The first gate insulating film 141, the second gate insulating film 142, and the first interlayer insulating film 161 may include a silicon nitride, a silicon oxide, and/or the like. The first gate insulating film 141, the second gate insulating film 142, and the first interlayer insulating film 161 may be formed as a single layer or a multilayer structure.

An oxide semiconductor including (e.g., made of) a metal oxide may be on the first interlayer insulating film 161. The oxide semiconductor may include at least one selected from among a primary metal oxide such as an indium (In) oxide, a tin (Sn) oxide, and/or a zinc (Zn) oxide; a binary metal oxide such as an In—Zn based oxide, a Sn—Zn based oxide, an aluminum (Al)—Zn based oxide, a Zn-magnesium (Mg) based oxide, a Sn—Mg based oxide, an In—Mg based oxide, and/or an In-gallium (Ga) based oxide; a ternary metal oxide such as an In—Ga—Zn based oxide, an In—Al—Zn based oxide, an In—Sn—Zn based oxide, a Sn—Ga—Zn based oxide, an Al—Ga—Zn based oxide, a Sn—Al—Zn based oxide, an In-hafnium (Hf)—Zn based oxide, an In-lanthanum (La)—Zn based oxide, an In-cerium (Ce)—Zn based oxide, an In-praseodymium (Pr)—Zn based oxide, an In-neodymium (Nd)—Zn based oxide, an In-samarium (Sm)—Zn based oxide, an In-europium (Eu)—Zn based oxide, an In-gadolinium (Gd)—Zn based oxide, an In-terbium (Tb)—Zn based oxide, an In-dysprosium (Dy)—Zn based oxide, an In-holmium (Ho)—Zn based oxide, an In-erbium (Er)—Zn based oxide, an In-thulium (Tm)—Zn, an In-ytterbium (Yb)—Zn based oxide, and/or an In-lutetium (Lu)—Zn based oxide; and a quaternary metal oxide such as an In—Sn—Ga—Zn based oxide, an In—Hf—Ga—Zn based oxide, an In—Al—Ga—Zn based oxide, an In—Sn—Al—Zn based oxide, an In—Sn—Hf—Zn based oxide, and/or an In—Hf—Al—Zn based oxide.

The display device according to the embodiment may include a transistor including a polycrystalline semiconductor and a transistor including an oxide semiconductor. For example, each pixel of the display device according to the embodiment may include a plurality of transistors, some of the plurality of transistors may include a polycrystalline semiconductor, and some other transistors from among the plurality of transistors may include an oxide semiconductor.

A third gate insulating film 143 may be on the first interlayer insulating film 161.

The reference voltage line 156 may be on the third gate insulating film 143. The third gate insulating film 143 is illustrated as being patterned to be only below the reference voltage line 156, but the present disclosure not limited thereto. For example, the third gate insulating film 143 may be on an entire surface of the first interlayer insulating film 161.

A second interlayer insulating film 162 may be on the reference voltage line 156. An opening 1161 may be in (e.g., may be formed in) the second interlayer insulating film 162. The opening 1161 of the second interlayer insulating film 162 may overlap (e.g., expose) at least a portion of the reference voltage line 156. For example, the opening 1161 of the second interlayer insulating film 162 may overlap (e.g., expose) an end portion of the reference voltage line 156. FIG. 3 and FIG. 4 illustrate that two openings 1161 overlapping the reference voltage line 156 are formed, but the present disclosure is not limited thereto. One opening 1161 overlapping the reference voltage line 156 may be formed, or three or more openings 1161 may be formed.

A first connecting electrode 2156 may be on the second interlayer insulating film 162. The first connecting electrode 2156 may be coupled to the reference voltage line 156 through the opening 1161 of the second interlayer insulating film 162. For example, the first connecting electrode 2156 may be coupled to an end portion of the reference voltage line 156.

A third interlayer insulating film 180 may be on the first connecting electrode 2156. An opening 1181 may be in (e.g., may be formed in) the third interlayer insulating film 180. The opening 1181 of the third interlayer insulating film 180 may overlap (e.g., expose) at least a portion of the first connecting electrode 2156. FIG. 3 and FIG. 4 illustrate that two openings 1181 overlapping (e.g., exposing) the first connecting electrode 2156 are formed, but the present disclosure is not limited thereto. One opening 1181 overlapping the first connecting electrode 2156 may be formed, and three or more openings 1181 may be formed.

The reference voltage supplying line 1156 and the dummy data line 171d may be spaced apart from each other on the third interlayer insulating film 180. The reference voltage supplying line 1156 may include the first protrusion 1156c branched from the reference voltage supplying line 1156 (e.g., from the portion of the reference voltage supplying line 1156 that substantially extends in the column direction). The first protrusion 1156c of the reference voltage supplying line 1156 may overlap the first connecting electrode 2156. The reference voltage supplying line 1156 may be coupled to the first connecting electrode 2156 through the opening 1181 of the third interlayer insulating film 180. The reference voltage supplying line 1156 may also overlap the reference voltage line 156.

As such, the reference voltage line 156 may be coupled to the reference voltage supplying line 1156 through the first connecting electrode 2156 to receive the reference voltage VEH. The reference voltage line 156 may be coupled to each pixel in the display area DA to transmit the reference voltage VEH.

A passivation layer 182 may be on the reference voltage supplying line 1156. An anode may be on the passivation layer 182 in the display area DA. A partition wall may be on the anode. An opening may be in (e.g., may be formed in) the partition wall, and the opening of the partition wall may overlap the anode. For example, the partition wall may be on (e.g., cover) a portion (e.g., an edge) of the anode, and the opening of the partition wall may expose another portion (e.g., a central portion) of the anode. In some embodiments, the anode may be provided in plurality, and the partition wall may separate (e.g., electrically isolate) the plurality of anodes. A light emitting element layer may be in the opening of the partition wall. A cathode may be on the light emitting element layer and the partition wall. In some embodiments, the cathode may be a common layer. The anode, the light emitting element layer, and the cathode may form a light emitting diode.

Hereinafter, a connecting portion of the first initializing voltage supplying line 1127 and the first initializing voltage line 127 will be described with reference to FIG. 3 and FIG. 5.

The buffer layer 111 and the first gate insulating film 141 may be on the substrate 110.

The first initializing voltage line 127 may be on the first gate insulating film 141.

The second gate insulating film 142, the first interlayer insulating film 161, and the second interlayer insulating film 162 may be on (e.g., stacked on) the first initializing voltage line 127. An opening 1163 may be in (e.g., may be formed in) the second interlayer insulating film 162. The opening 1163 of the second interlayer insulating film 162 may overlap (e.g., expose) at least a portion of the first initializing voltage line 127. The opening 1163 of the second interlayer insulating film 162 may overlap (e.g., expose) an end portion of the first initializing voltage line 127. The opening 1163 may be in (e.g., may be formed in) the first interlayer insulating film 161 and the second gate insulating film 142 as well as the second interlayer insulating film 162. FIG. 3 and FIG. 5 illustrate that two openings 1163 overlapping the first initializing voltage line 127 are formed, but the present disclosure is not limited thereto. One opening 1163 overlapping the first initializing voltage line 127 may be formed, or three or more openings 1163 may be formed.

A second connecting electrode 2127 may be on the second interlayer insulating film 162. The second connecting electrode 2127 may be coupled to the first initializing voltage line 127 through the opening 1163 of the second interlayer insulating film 162. For example, the second connecting electrode 2127 may be coupled to an end portion of the first initializing voltage line 127. A lower wire 1127*a* of the first initializing voltage supplying line 1127 may be on the second interlayer insulating film 162 to be spaced apart from the second connecting electrode 2127.

The third interlayer insulating film 180 may be on the second connecting electrode 2127 and the lower wire 1127*a* of the first initializing voltage supplying line 1127. Openings 1183 and 1185 may be in (e.g., may be formed in) the third interlayer insulating film 180. The openings 1183 and 1185 of the third interlayer insulating film 180 may include an opening 1183 at least partially overlapping (e.g., exposing) the first initializing voltage supplying line 1127 and an opening 1185 at least partially overlapping (e.g., exposing) the second connecting electrode 2127. FIG. 3 and FIG. 5 illustrate that one opening 1183 overlapping the first initializing voltage supplying line 1127 is formed, but the present disclosure is not limited thereto. Two or more openings 1183 overlapping the first initializing voltage supplying line 1127 may be formed. In addition, it is illustrated that two openings 1185 overlapping the second connecting electrode 2127 are formed, but the present disclosure is not limited thereto. One opening 1185 overlapping the second connecting electrode 2127 may be formed, and three or more openings 1185 may be formed.

An upper wire 1127*b* of the first initializing voltage supplying line 1127 may be on the third interlayer insulating film 180. The upper wire 1127*b* of the first initializing voltage supplying line 1127 may overlap the lower wire 1127*a*. The upper wire 1127*b* of the first initializing voltage supplying line 1127 may be coupled to the lower wire 1127*a* through the opening 1183 of the third interlayer insulating film 180. The first initializing voltage supplying line 1127 may include the second protrusion 1127*c* branched from the first initializing voltage supplying line 1127. The first initializing voltage supplying line 1127 and the second protrusion 1127*c* may branch from the upper wire 1127*b* of the first initializing voltage supplying line 1127. For example, the first initializing voltage supplying line 1127 may include the second protrusion 1127*c* branched from the upper wire 1127*b*. The second protrusion 1127*c* of the first initializing voltage supplying line 1127 may overlap the second connecting electrode 2127. The first initializing voltage supplying line 1127 may be coupled to the second connecting electrode 2127 through the opening 1185 of the third interlayer insulating film 180. The first initializing voltage supplying line 1127 may also overlap the first initializing voltage line 127.

As such, the first initializing voltage line 127 may be coupled to the first initializing voltage supplying line 1127 through the second connecting electrode 2127 to receive the first initializing voltage VINT1. The first initializing voltage line 127 may be coupled to each pixel in the display area DA to transmit the first initializing voltage VINT1.

The passivation layer 182 may be on the first initializing voltage supplying line 1127.

Hereinafter, a connecting portion of the second initializing voltage supplying line 1128 and the second initializing voltage line 128 will be described with reference to FIG. 3 and FIG. 6.

The buffer layer 111, the first gate insulating film 141, the second gate insulating film 142, the first interlayer insulating film 161, and the second interlayer insulating film 162 may be stacked on the substrate 110.

The second initializing voltage line 128 may be on the second interlayer insulating film 162. In addition, a lower wire 1128*a* of the second initializing voltage supplying line 1128 may be on the second interlayer insulating film 162 to be spaced apart from the second initializing voltage line 128.

The third interlayer insulating film 180 may be on the second initializing voltage line 128 and the lower wire 1128*a* of the second initializing voltage supplying line 1128. Openings 1187 and 1189 may be in (e.g., may be formed in) the third interlayer insulating film 180. The openings 1187 and 1189 of the third interlayer insulating film 180 may include an opening 1187 at least partially overlapping (e.g., exposing) the lower wire 1128*a* of the second initializing voltage supplying line 1128 and an opening 1189 at least partially overlapping (e.g., exposing) the second initializing voltage line 128. FIG. 3 and FIG. 6 illustrate that one opening 1187 overlapping the lower wire 1128*a* of the second initializing voltage supplying line 1128 is formed, but the present disclosure is not limited thereto. Two or more openings 1187 overlapping the lower wire 1128*a* of the second initializing voltage supplying line 1128 may be formed. The opening 1189 overlapping the second initializing voltage line 128 may overlap (e.g., expose) an end portion of the second initializing voltage line 128. It is illustrated that two openings 1189 overlapping the second initializing voltage line 128 are formed, but the present disclosure is not limited thereto. One opening 1189 overlapping the second initializing voltage line 128 may be formed, or three or more openings 1189 may be formed.

An upper wire 1128*b* of the second initializing voltage supplying line 1128 may be on the third interlayer insulating film 180. The upper wire 1128*b* of the second initializing voltage supplying line 1128 may overlap the lower wire 1128*a*. The upper wire 1128*b* of the second initializing voltage supplying line 1128 may be coupled to the lower wire 1128*a* through the opening 1187 of the third interlayer insulating film 180. The second initializing voltage supplying line 1128 may include the third protrusion 1128*c* branched from the second initializing voltage supplying line 1128. The third protrusion 1128*c* of the second initializing voltage supplying line 1128 may branch from the upper wire 1128*b* of the second initializing voltage supplying line 1128. The third protrusion 1128*c* of the second initializing voltage supplying line 1128 may overlap the second initializing voltage line 128. The third protrusion 1128*c* of the second initializing voltage supplying line 1128 may overlap an end portion of the second initializing voltage line 128. The second initializing voltage supplying line 1128 may be coupled to the second initializing voltage line 128 through the opening 1189 of the third interlayer insulating film 180. The second initializing voltage supplying line 1128 may be coupled to an end portion of the second initializing voltage line 128.

As such, the second initializing voltage line 128 may be coupled to the second initializing voltage supplying line 1128 to receive the second initializing voltage VINT2. The second initializing voltage line 128 may be coupled to each pixel in the display area DA to transmit the second initializing voltage VINT2.

The passivation layer 182 may be on the second initializing voltage supplying line 1128.

Hereinafter, one pixel in the display area of the display device according to the embodiment will be described with reference to FIG. 7.

Figure 7:
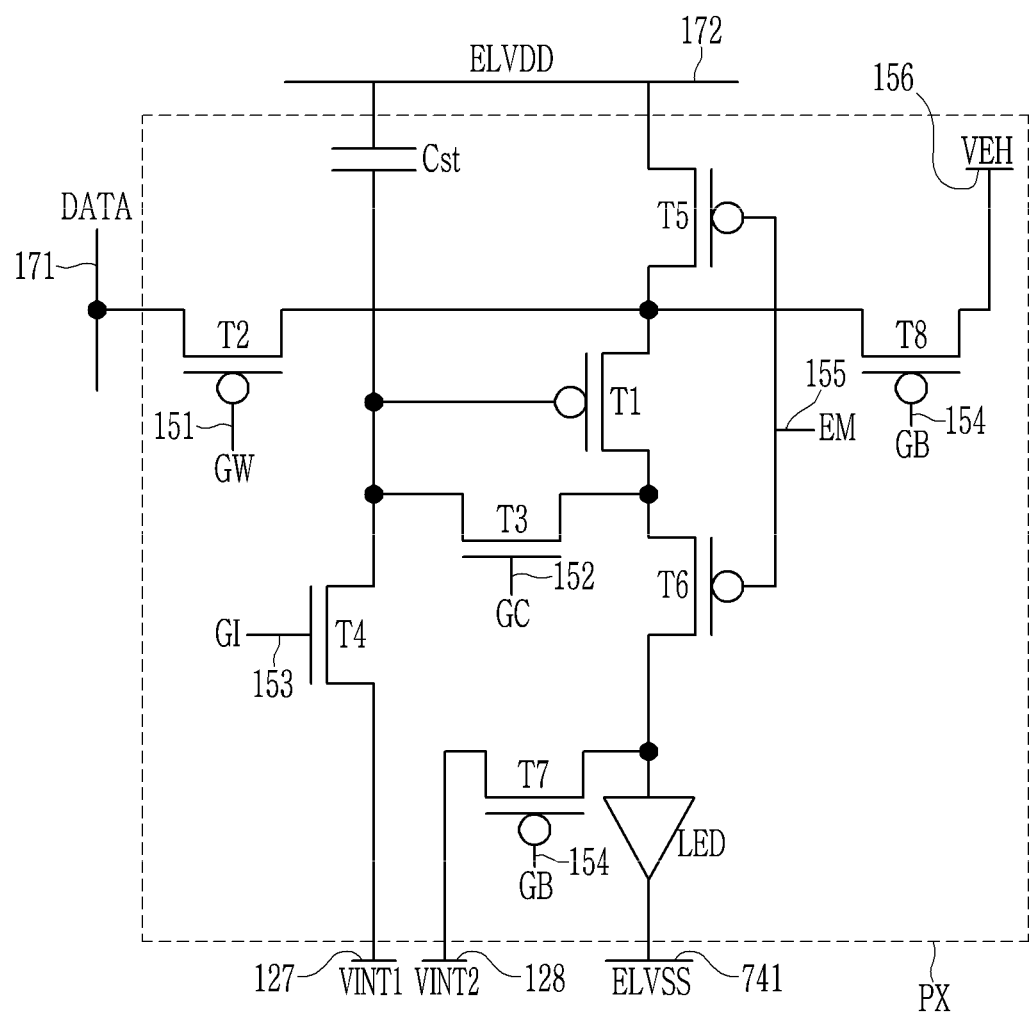
FIG. 7 illustrates a circuit diagram of one pixel of a display device according to an embodiment.

FIG. 7 illustrates a circuit diagram of one pixel of a display device according to an embodiment.

One pixel PX of the display device according to the embodiment may include a plurality of transistors T1, T2, T3, T4, T5, T6, T7, and T8, a storage capacitor Cst, and a light emitting diode LED coupled to various signal lines.

The display device according to the embodiment includes a display area in which an image is displayed, and the pixels PX are arranged in various suitable forms in the display area.

A plurality of signal lines 127, 128, 151, 152, 153, 154, 155, 156, 171, 172, and 741 are coupled to one pixel PX. The plurality of signal lines include a first initializing voltage line 127, a second initializing voltage line 128, a scan line 151, an inverted scan line 152, an initializing control line 153, a bypass control line 154, a light emitting control line 155, a reference voltage line 156, a data line 171, and a driving voltage line 172, and a common voltage line 741.

The scan line 151 is coupled to a gate driving portion to transmit a scan signal GW to the second transistor T2. The inverted scan line 152 may be applied with a voltage having an opposite polarity to that applied to the scan line 151 at the same or substantially the same time (e.g., simultaneously or concurrently) that a signal (e.g., the scan signal GW) is applied to the scan line 151. For example, when a high voltage is applied to the scan line 151, a low voltage may be applied (e.g., simultaneously or concurrently applied) to the inverted scan line 152. The inverted scan line 152 is to transmit an inverted scan signal GC to the third transistor T3.

The initializing control line 153 is to transmit an initializing control signal GI to the fourth transistor T4. The bypass control line 154 is to transmit a bypass signal GB to the seventh transistor T7. The bypass control line 154 may be formed as a rear end of the scan line 151. For example, in some embodiments, the bypass control line 154 may be coupled to the scan line 151. The light emitting control line 155 is to transmit a light emitting control signal EM to the fifth transistor T5 and the sixth transistor T6.

The data line 171 is a wire to transmit a data voltage DATA generated by a data driving portion, and luminance at which a light emitting diode LED emits light is changed according to (e.g., depends on) the data voltage DATA applied to the pixel PX.

The driving voltage line 172 is to apply a driving voltage ELVDD, and the reference voltage line 156 is to apply the reference voltage VEH. The first initializing voltage line 127 is to transmit the first initializing voltage VINT1, and the second initializing voltage line 128 is to transmit the second initializing voltage VINT2. The common voltage line 741 is to apply a common voltage ELVSS to a cathode of the light emitting diode LED. In the present embodiment, voltages applied to the driving voltage line 172, the reference voltage line 156, the first and second initializing voltage lines 127 and 128, and the common voltage line 741 may be constant voltages (e.g., voltages having a constant magnitude when applied), respectively.

Hereinafter, a structure and connection relationship of the plurality of transistors will be described in more detail.

The driving transistor T1 may have a p-type (e.g., p-based) transistor characteristic, and may include a polycrystalline semiconductor. The driving transistor T1 may receive the data voltage DATA according to a switching operation of the second transistor T2 to supply a driving current to the anode of the light emitting diode LED. Brightness of the light emitting diode LED is controlled in accordance with an amount of the driving current outputted to the anode of the light emitting diode LED. Thus, luminance of the light emitting diode LED may be controlled according to the data voltage DATA applied to the pixel PX. To this end, a first electrode of the driving transistor T1 is to receive the driving voltage ELVDD, and is coupled to the driving voltage line 172 via (e.g., through) the fifth transistor T5. In addition, the first electrode of the driving transistor T1 is coupled to a second electrode of the second transistor T2 to receive the data voltage DATA. A second electrode of the driving transistor T1 is to output a current toward the light emitting diode LED, and is coupled to the anode of the light emitting diode LED via (e.g., through) the sixth transistor T6. In addition, the second electrode of the driving transistor T1 is to transmit the data voltage DATA applied to the first electrode of the driving transistor T1 to the third transistor T3. Meanwhile, a gate electrode of the driving transistor T1 is coupled to one electrode (hereinafter also referred to as a second storage electrode) of the storage capacitor Cst. Accordingly, a voltage of the gate electrode of the driving transistor T1 is changed according to (e.g., depends on) a voltage stored in the storage capacitor Cst, so that a driving current outputted from the driving transistor T1 is changed (e.g., is changed according to the voltage stored in the storage capacitor Cst). In addition, the storage capacitor Cst serves to maintain a voltage of the gate electrode of the driving transistor T1 constant during one frame.

The second transistor T2 may have a p-type (e.g., p-based) transistor characteristic, and may include a polycrystalline semiconductor. The second transistor T2 is a transistor to receive the data voltage DATA into the pixel PX. A gate electrode of the second transistor T2 is coupled to the scan line 151. A first electrode of the second transistor T2 is coupled to the data line 171. A second electrode of the second transistor T2 is coupled to the first electrode of the driving transistor T1. When the second transistor T2 is turned on depending on a low voltage of (e.g., is turned on by a low voltage of) the first scan signal GW transmitted through the scan line 151, the data voltage DATA transmitted through the data line 171 is transmitted to the first electrode of the driving transistor T1.

The third transistor T3 may have an n-type (e.g., n-based) transistor characteristic, and may include an oxide semiconductor. The third transistor T3 electrically couples the second electrode of the driving transistor T1 and the gate electrode of the driving transistor T1. As a result, the third transistor T3 is a transistor that allows a compensation voltage such that the data voltage DATA is changed via the driving transistor T1 to be transmitted to the second storage electrode of the storage capacitor Cst. A gate electrode of the third transistor T3 is coupled to the inverted scan line 152, and a first electrode of the third transistor T3 is coupled to the second electrode of the driving transistor T1. A second electrode of the third transistor T3 is coupled to the second storage electrode of the storage capacitor Cst and the gate electrode of the driving transistor T1. The third transistor T3 is turned on by a high voltage from among (e.g., by a high voltage of a signal from among) the inverted scan signals GC received through the inverted scan line 152 to couple (e.g., connect) the gate electrode of the driving transistor T1 and the second electrode of the driving transistor T1. The third transistor T3 is to transmit the voltage applied to the second electrode of the driving transistor T1 to the second storage electrode of the storage capacitor Cst to store it in the storage capacitor Cst.

The fourth transistor T4 may have an n-type (e.g., n-based) transistor characteristic, and may include an oxide semiconductor. The fourth transistor T4 serves to initialize the gate electrode of the driving transistor T1 and the second storage electrode of the storage capacitor Cst. A gate electrode of the fourth transistor T4 is coupled to the initializing control line 153, and a first electrode of the fourth transistor T4 is coupled to the first initializing voltage line 127. A second electrode of the fourth transistor T4 is coupled to the second storage electrode of the storage capacitor Cst and the gate electrode of the driving transistor T1. The fourth transistor T4 is turned on by a high voltage from among (e.g., by a high voltage of a signal from among) the initializing control signals GI received through the initializing control line 153. In some embodiments, the fourth transistor T4 is to transmit the first initializing voltage VINT1 to the gate electrode of the driving transistor T1 and the second storage electrode of the storage capacitor Cst. Thus, the voltage of the gate electrode of the driving transistor T1 and the storage capacitor Cst are initialized.

The fifth transistor T5 may have a p-type (e.g., p-based) transistor characteristic, and may include a polycrystalline semiconductor. The fifth transistor T5 serves to transmit the driving voltage ELVDD to the driving transistor T1. A gate electrode of the fifth transistor T5 is coupled to the light emitting control line 155, a first electrode of the fifth transistor T5 is coupled to the driving voltage line 172, and a second electrode of the fifth transistor T5 is the first electrode of the driving transistor T1.

The sixth transistor T6 may have a p-type (e.g., p-based) transistor characteristic, and may include a polycrystalline semiconductor. The sixth transistor T6 serves to transmit the driving current outputted from the driving transistor T1 to the light emitting diode LED. A gate electrode of the sixth transistor T6 is coupled to the light emitting control line 155, a first electrode of the sixth transistor T6 is coupled to the second electrode of the driving transistor T1, and a second electrode of the sixth transistor T6 is coupled to the anode of the light emitting diode LED.

The seventh transistor T7 may have a p-type (e.g., p-based) transistor characteristic, and may include a polycrystalline semiconductor. The seventh transistor T7 serves to initialize the anode of the light emitting diode LED. A gate electrode of the seventh transistor T7 is coupled to the bypass control line 154, a first electrode of the seventh transistor T7 is coupled to the anode of the light emitting diode LED, and a second electrode of the seventh transistor T7 is coupled to the second initializing voltage line 128. When the seventh transistor T7 is turned on by a low voltage of the bypass signal GB, the second initializing voltage VINT2 is applied to the anode of the light emitting diode LED to be initialized.

The eighth transistor T8 may have a p-type (e.g., p-based) transistor characteristic, and may include a polycrystalline semiconductor. A gate electrode of the eighth transistor T8 is coupled to the bypass control line 154, a first electrode of the eighth transistor T8 is coupled to the reference voltage line 156, and a second electrode of the eighth transistor T8 is coupled to the first electrode of the driving transistor T1. When the eighth transistor T8 is turned on by a low voltage of the bypass signal GB, the reference voltage VEH is applied to the first electrode of the driving transistor T1.

Although it is described that one pixel includes eight transistors T1 to T8 and one storage capacitor Cst, the present disclosure is not limited thereto, and the number of transistors, the number of capacitors, and their coupling (e.g., connection) relationship may be variously and suitably changed.

In the present embodiment, the driving transistor T1 may include a polycrystalline semiconductor. In addition, the third transistor T3 and the fourth transistor T4 may include an oxide semiconductor. The second transistor T2, the fifth transistor T5, the sixth transistor T6, the seventh transistor T7, and the eighth transistor T8 may include a polycrystalline semiconductor. However, the present disclosure is not limited thereto, and at least one selected from among the second transistor T2, the fifth transistor T5, the sixth transistor T6, the seventh transistor T7, and the eighth transistor T8 may include an oxide semiconductor. In the present embodiment, the third transistor T3 and the fourth transistor T4 include a different semiconductor material from that of the driving transistor T1, so that they may be driven more stably, and reliability thereof may be improved.

Wires to supply voltages to drive the pixel PX, such as the reference voltage VEH, the first initializing voltage VINT1, and the second initializing voltage VINT2, are generally in the wire area LA in some devices. In this embodiment, a bezel may be reduced by including (e.g., positioning) the wire to supply the reference voltage VEH (e.g., the reference voltage supplying line 1156) among the wires in the dummy area MA. A constant DC voltage may be applied to the wire to supply the reference voltage VEH. For example, a constant voltage of about 5 V to 6 V may be applied thereto. However, this is merely an example, and the reference voltage VEH may be variously and suitably changed. By including (e.g., positioning) the reference voltage supplying line 1156 to supply the reference voltage VEH and the dummy data line 171*d* to supply the dummy data voltage (dummy DATA) in the dummy area MA, a pixel at an outermost portion of the display area DA may have similar parasitic capacitance to (e.g., compared to) other pixels. Therefore, it is possible to prevent a difference in luminance, or to reduce the difference in luminance, depending on positions of pixels.

Hereinafter, a display device according to an embodiment will be described with reference to FIG. 8.

Figure 8:
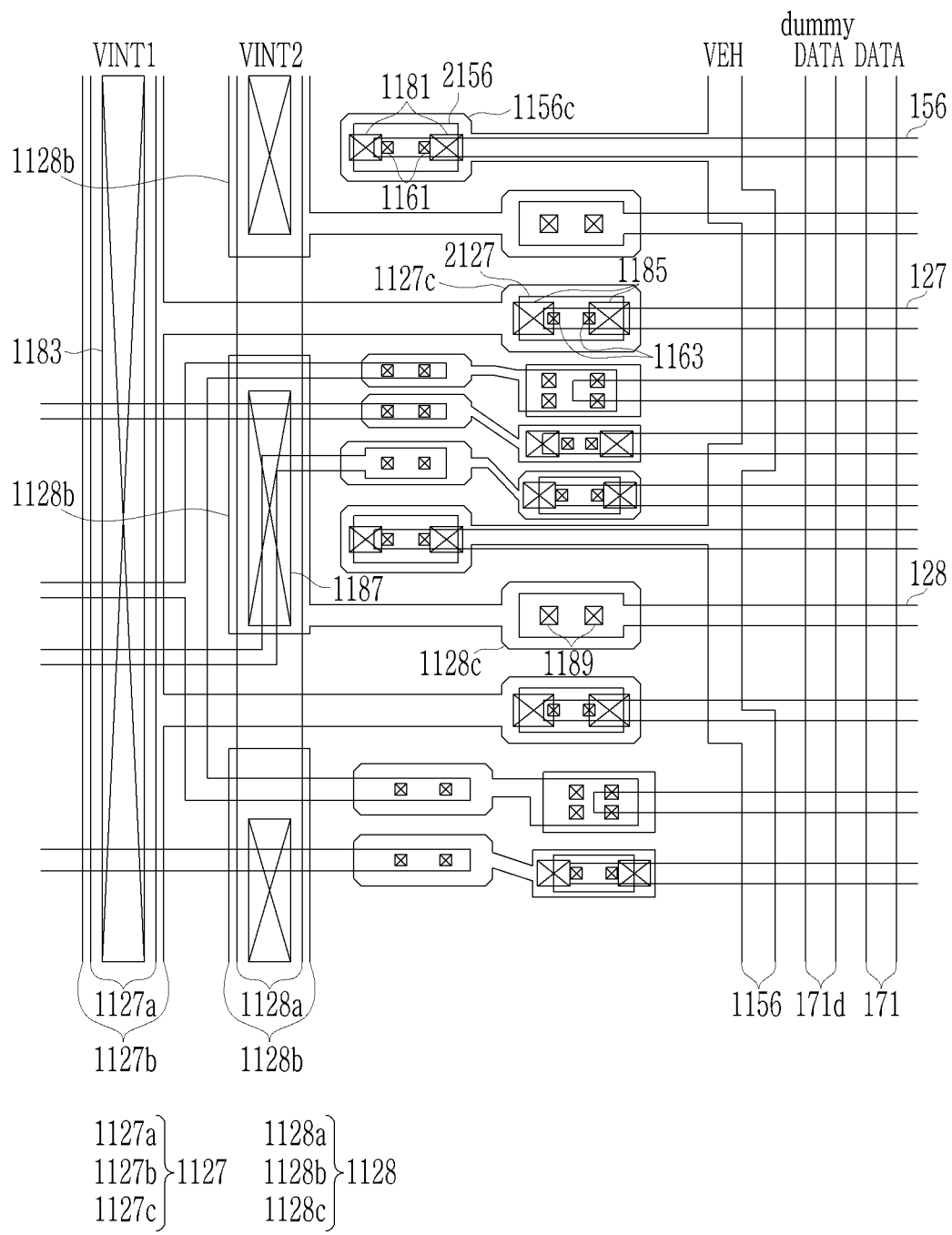
FIG. 8 illustrates a top plan view of a partial area of a display device according to an embodiment.

Because some portions (e.g., features) of the display device according to the embodiment of FIG. 8 are the same as those of the display device according to the embodiment of FIG. 1 to FIG. 7, a repeated description thereof may not be repeated. The present embodiment differs from the previous embodiment (e.g., the embodiment described with reference to FIG. 3) in that the reference voltage supplying line has a bent shape, which will be further described below.

FIG. 8 illustrates a top plan view of a partial area of a display device according to an embodiment.

The reference voltage supplying line 1156 to supply the reference voltage VEH and the dummy data line 171*d* to supply the dummy data voltage (dummy DATA) may be in the dummy area MA of the display device according to the embodiment. The reference voltage supplying line 1156 and the dummy data line 171*d* may substantially extend in the column direction.

In the above embodiment (e.g., the embodiment described with reference to FIG. 3), the reference voltage supplying line 1156 is in (e.g., is formed in) a bar shape extending along the column direction, while in the present embodiment, the reference voltage supplying line 1156 is in (e.g., is formed in) a bar shape that extends in the column direction and some part of which is bent. The reference voltage supplying line 1156 extends from an upper side thereof to (e.g., toward) a lower side thereof and is bent to (e.g., toward) the right at a set or predetermined point, again extends to (e.g., toward) the lower side thereof and is bent to (e.g., toward) the left at a set or predetermined point, again extends to (e.g., toward) the lower side thereof and is bent to (e.g., toward) the right at a set or predetermined point, and then again extends downward. However, the shape of the reference voltage supplying line 1156 illustrated in FIG. 8 is merely an example, and the shape of the reference voltage supplying line 1156 may be variously and suitably modified.

Hereinafter, a display device according to an embodiment will be described with reference to FIG. 9 and FIG. 10.

Figure 9:
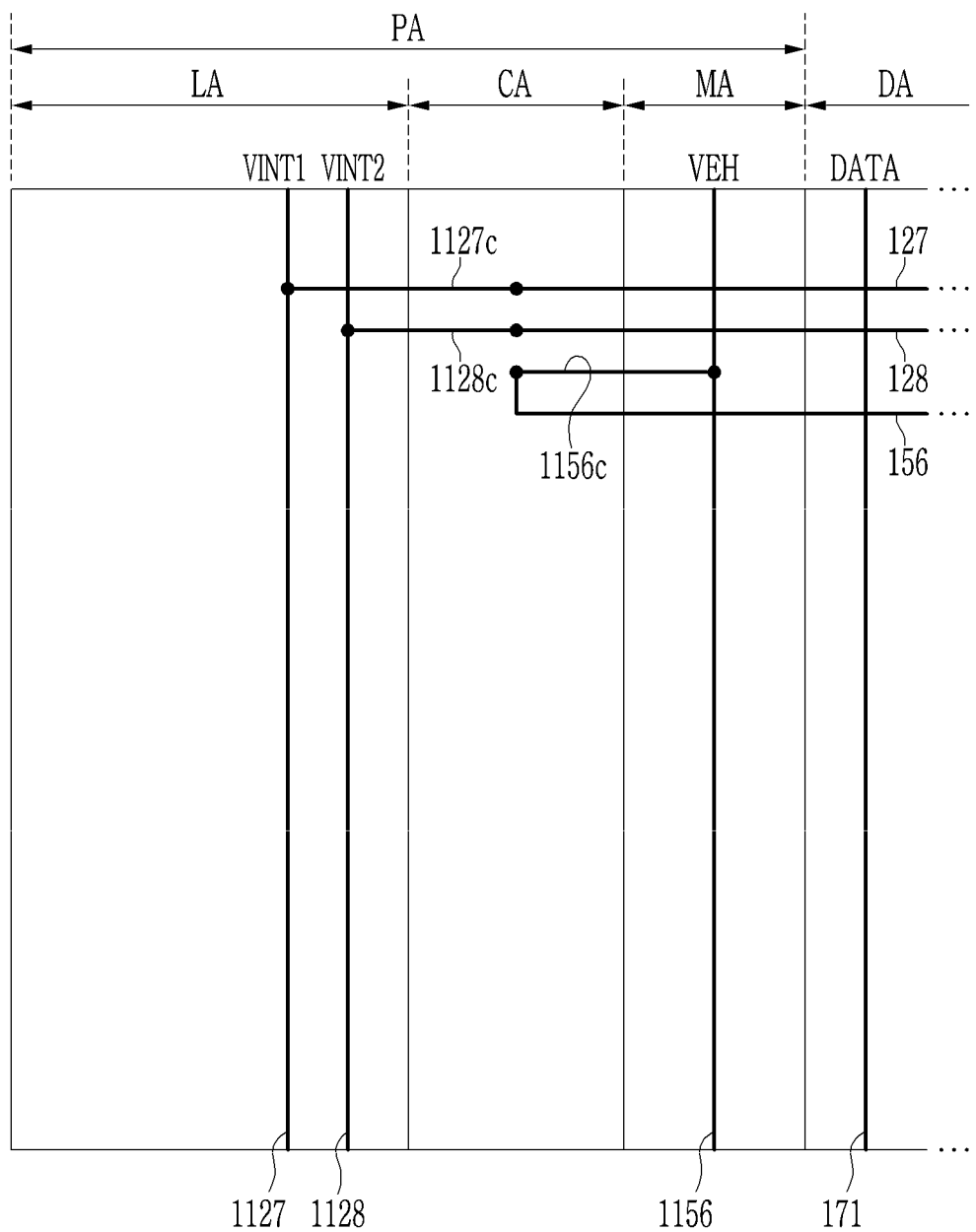
FIG. 9 is a diagram illustrating wires in a partial area of a display device according to an embodiment.
Figure 10:
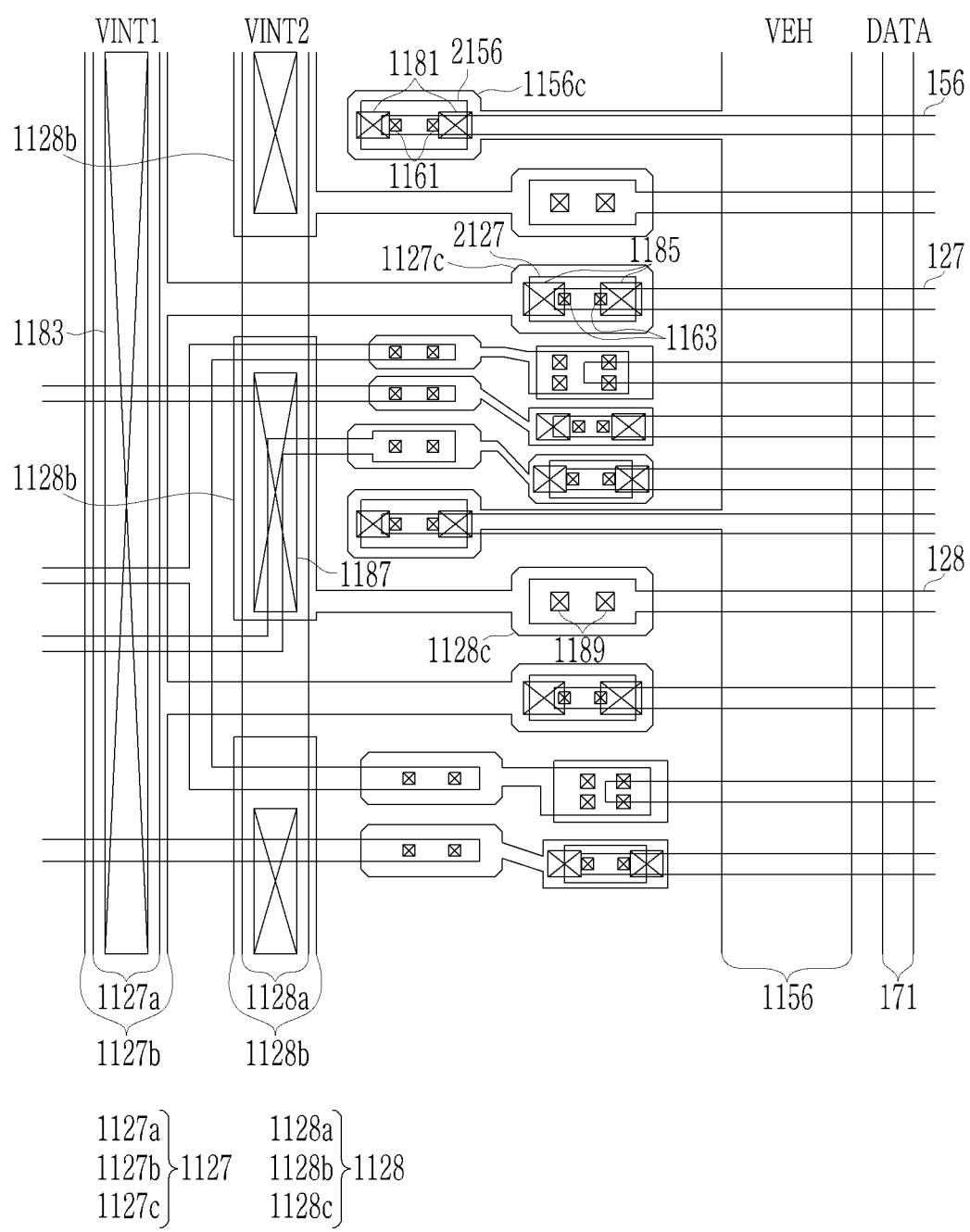
FIG. 10 illustrates a top plan view of a partial area of a display device according to an embodiment.

Because some portions (e.g., features) of the display device according to the embodiment of FIG. 9 and FIG. 10 are the same as those of the display device according to the embodiment of FIG. 1 to FIG. 7, a repeated description thereof may not be repeated. The present embodiment is different from the aforementioned embodiment in that the dummy data line is omitted, and this will be described in more detail below.

FIG. 9 is a diagram illustrating wires in a partial area of a display device according to an embodiment, and FIG. 10 illustrates a top plan view of a partial area of a display device according to an embodiment.

The display device according to the embodiment may include the display area DA and the peripheral area PA, and the peripheral area PA may include the dummy area MA, the connecting area CA, and the wire area LA.

The reference voltage line 156, the first initializing voltage line 127, and the second initializing voltage line 128 that extend in the row direction, and the data line 171 that extends in the column direction, may be in the display area DA.

The reference voltage supplying line 1156 extending in the column direction may be in the dummy area MA. In the above embodiment (e.g., the embodiment described with reference to FIG. 2), the reference voltage supplying line 1156 and the dummy data line 171*d* are side by side in the dummy area MA, while in the present embodiment, the reference voltage supplying line 1156 is in the dummy area MA, and the dummy data line 171*d* is not in the dummy area MA. Therefore, a width of the reference voltage supplying line 1156 may be further widened (e.g., compared to when the dummy data line 171*d* is in the dummy area MA), and in this case, resistance of the reference voltage supplying line 1156 may be lowered. For example, in the present embodiment, the width of the reference voltage supplying line 1156 may be larger than a sum of a width of the reference voltage supplying line 1156 and a width of the dummy data line 171*d* in the previous embodiment (e.g., the embodiment described with reference to FIG. 2). However, this is merely an example, and the width of the reference voltage supplying line 1156 may be variously and suitably changed. In addition, the width of the reference voltage supplying line 1156 may be maintained the same (e.g., may be the same) as that in the previous embodiment (e.g., the embodiment described with reference to FIG. 2), and the width of the dummy area MA may be reduced.

Hereinafter, a display device according to an embodiment will be described with reference to FIG. 11.

Figure 11:
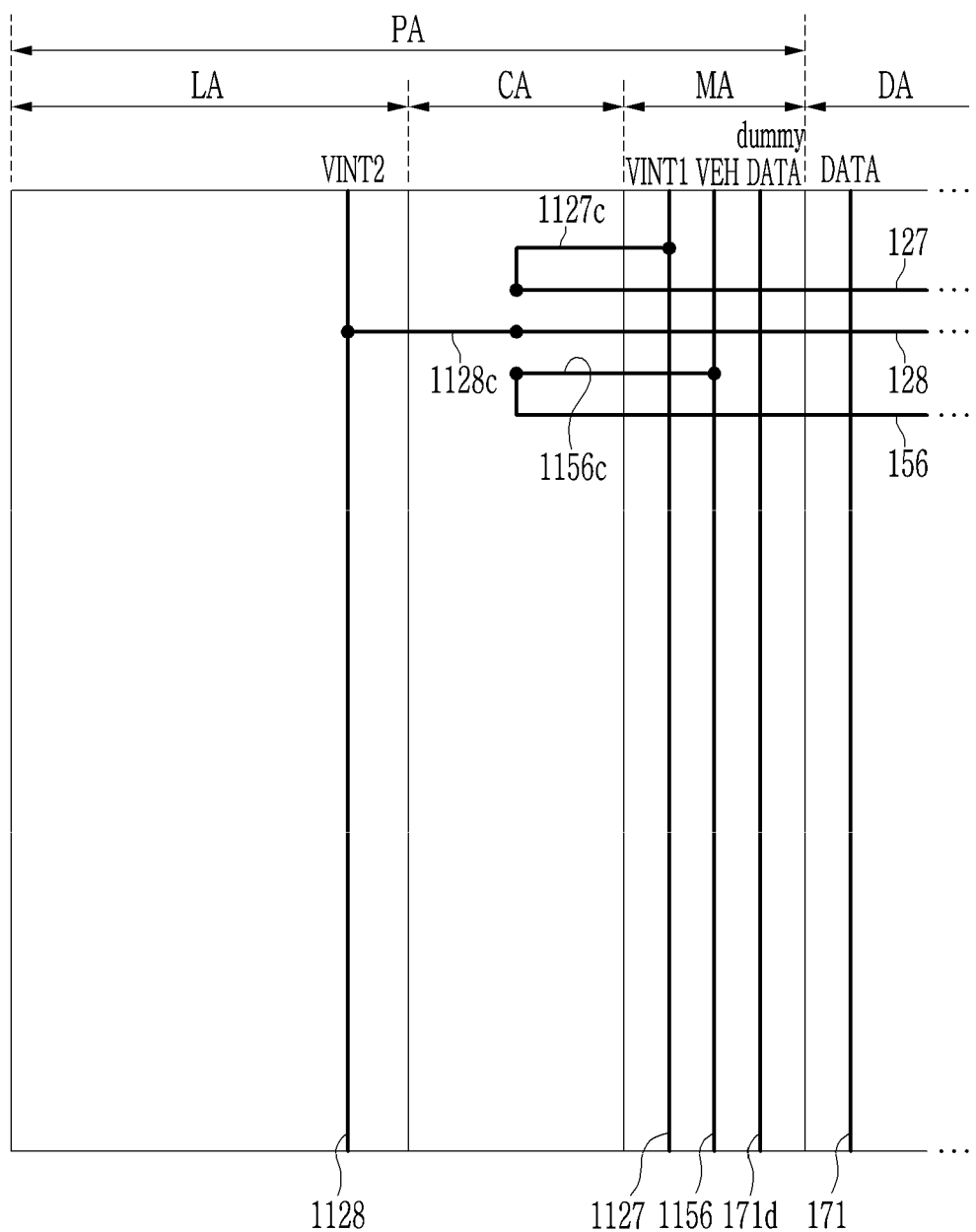
FIG. 11 is a diagram illustrating wires in a partial area of a display device according to an embodiment.

Because some portions (e.g., features) of the display device according to the embodiment of FIG. 11 are the same as those of the display device according to the embodiment of FIG. 1 to FIG. 7, a repeated description thereof may not be repeated. The present embodiment differs from the previous embodiment (e.g., the embodiment described with reference to FIG. 2) in that the first initializing voltage supplying line is in the dummy area, which will be further described below.

FIG. 11 is a diagram illustrating wires in a partial area of a display device according to an embodiment.

The display device according to the embodiment may include the display area DA and the peripheral area PA, and the peripheral area PA may include the dummy area MA, the connecting area CA, and the wire area LA.

The reference voltage line 156, the first initializing voltage line 127, and the second initializing voltage line 128 that extend in the row direction, and the data line 171 that extends in the column direction may be in the display area DA.

The reference voltage supplying line 1156 and the dummy data line 171*d* that extend in the column direction may be in the dummy area MA. In the above-described embodiment (e.g., the embodiment described with reference to FIG. 2), the first initializing voltage supplying line 1127 is in the wire area LA, while in the present embodiment, the first initializing voltage supplying line 1127 may be in the dummy area MA. Although it is illustrated that the first initializing voltage supplying line 1127 includes the second protrusion 1127*c*, and the second protrusion 1127*c* of the first initializing voltage supplying line 1127 is coupled to the first initializing voltage line 127 in the connecting area CA, the present disclosure is not limited thereto. For example, the first initializing voltage supplying line 1127 may be coupled to the first initializing voltage line 127 in the dummy area MA.

The dummy data line 171*d* in the dummy area MA may be omitted in some cases. In this case, the widths of the first initializing voltage supplying line 1127 and the reference voltage supplying line 1156 in the dummy area MA may be further widened (e.g., compared to when the dummy data line 171*d* is in the dummy area MA).

Hereinafter, a display device according to an embodiment will be described with reference to FIG. 12.

Figure 12:
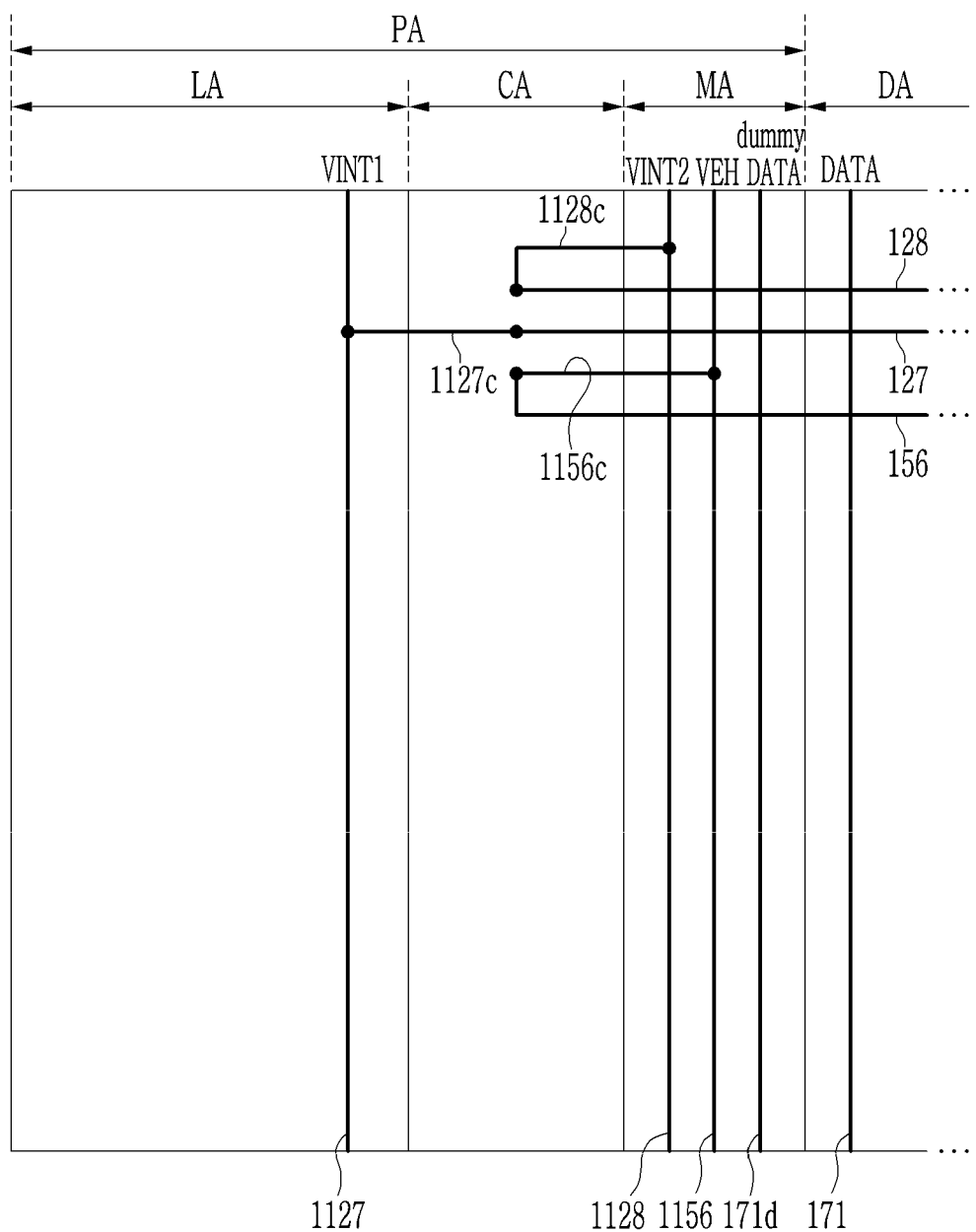
FIG. 12 is a diagram illustrating wires in a partial area of a display device according to an embodiment.

Because some portions (e.g., features) of the display device according to the embodiment of FIG. 12 are the same as those of the display device according to the embodiment of FIG. 1 to FIG. 7, a repeated description thereof may not be repeated. The present embodiment differs from the previous embodiment (e.g., the embodiment described with reference to FIG. 2) in that the second initializing voltage supplying line is in the dummy area, which will be further described below.

FIG. 12 is a diagram illustrating wires in a partial area of a display device according to an embodiment.

The display device according to the embodiment may include the display area DA and the peripheral area PA, and the peripheral area PA may include the dummy area MA, the connecting area CA, and the wire area LA.

The reference voltage line 156, the first initializing voltage line 127, and the second initializing voltage line 128 that extend in the row direction, and the data line 171 that extends in the column direction may be in the display area DA.

The reference voltage supplying line 1156 and the dummy data line 171*d* that extend in the column direction may be in the dummy area MA. In the above-described embodiment, the second initializing voltage supplying line 1128 is in the wire area LA, while in the present embodiment, the second initializing voltage supplying line 1128 may be in the dummy area MA. It is illustrated that the second initializing voltage supplying line 1128 includes the third protrusion 1128*c*, and the third protrusion 1128*c* of the second initializing voltage supplying line 1128 is coupled to the second initializing voltage line 128 in the connecting area CA, but the present disclosure is not limited thereto. For example, the second initializing voltage supplying line 1128 may be coupled to the second initializing voltage line 128 in the dummy area MA.

The dummy data line 171*d* in the dummy area MA may be omitted in some cases. In this case, the widths of the second initializing voltage supplying line 1128 and the reference voltage supplying line 1156 in the dummy area MA may be further widened.

Hereinafter, a display device according to an embodiment will be described with reference to FIG. 13.

Figure 13:
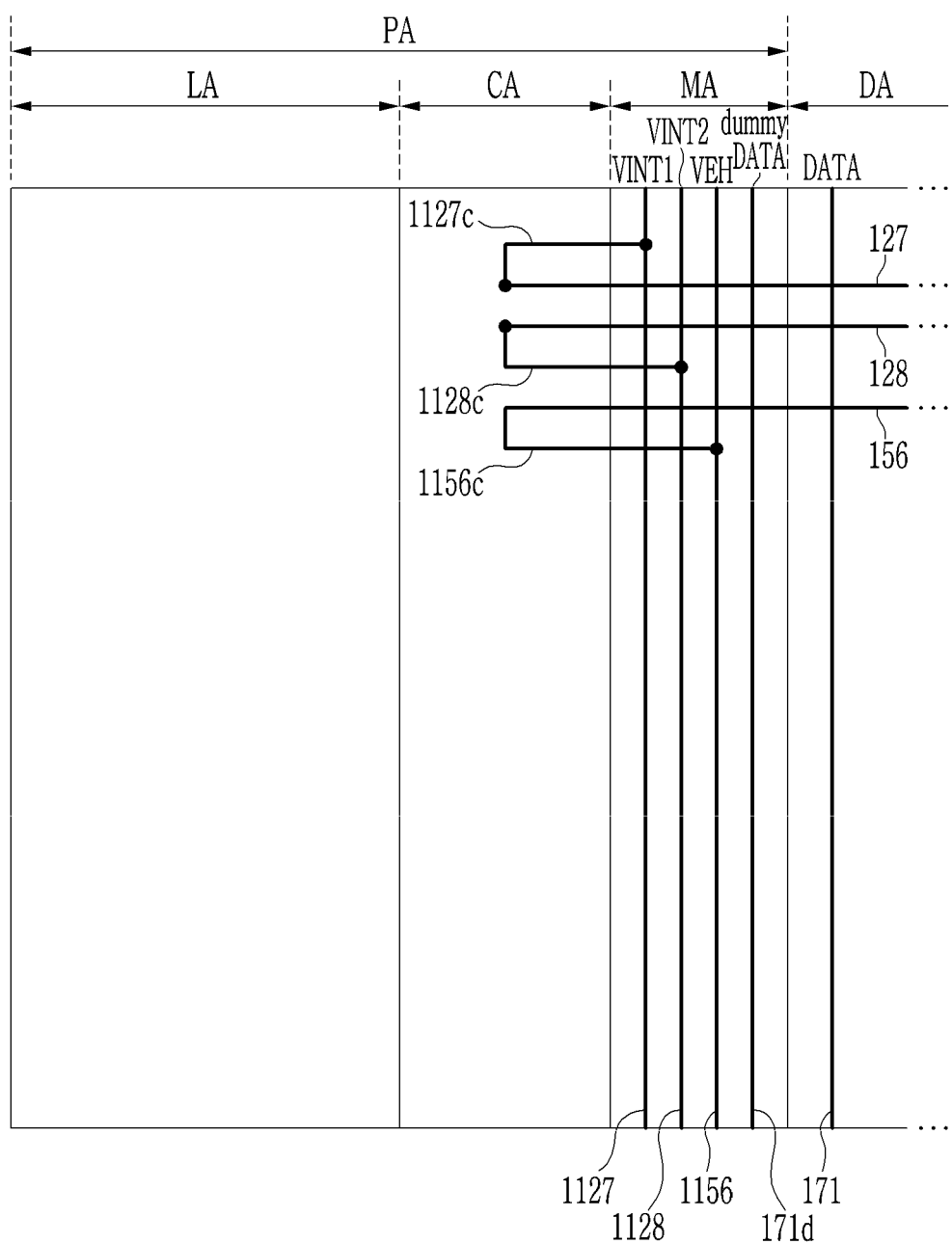
FIG. 13 is a diagram illustrating wires in a partial area of a display device according to an embodiment.

Because some portions (e.g., features) of the display device according to the embodiment of FIG. 13 are the same as those of the display device according to the embodiment of FIG. 1 to FIG. 7, a repeated description thereof may not be repeated. The present embodiment differs from the previous embodiment (e.g., the embodiment described with reference to FIG. 2) in that the first and second initializing voltage supplying lines are in the dummy area, which will be further described below.

FIG. 13 is a diagram illustrating wires in a partial area of a display device according to an embodiment.

The display device according to the embodiment may include the display area DA and the peripheral area PA, and the peripheral area PA may include the dummy area MA, the connecting area CA, and the wire area LA.

The reference voltage line 156, the first initializing voltage line 127, and the second initializing voltage line 128 that extend in the row direction, and the data line 171 that extends in the column direction may be in the display area DA.

The reference voltage supplying line 1156 and the dummy data line 171*d* that extend in the column direction may be in the dummy area MA. In the above embodiment (e.g., the embodiment described with reference to FIG. 2), the first initializing voltage supplying line 1127 and the second initializing voltage supplying line 1128 are in the wire area LA, while in the present embodiment, the first initializing voltage supplying line 1127 and the second initializing voltage supplying line 1128 may be in the dummy area MA. It is illustrated that the first initializing voltage supplying line 1127 includes the second protrusion 1127*c*, and the second protrusion 1127*c* of the first initializing voltage supplying line 1127 is coupled to the first initializing voltage line 127 in the connecting area CA, but the present disclosure is not limited thereto. For example, the first initializing voltage supplying line 1127 may be coupled to the first initializing voltage line 127 in the dummy area MA. It is illustrated that the second initializing voltage supplying line 1128 includes the third protrusion 1128*c*, and the third protrusion 1128*c* of the second initializing voltage supplying line 1128 is coupled to the second initializing voltage line 128 in the connecting area CA, but the present disclosure is not limited thereto. For example, the second initializing voltage supplying line 1128 may be coupled to the second initializing voltage line 128 in the dummy area MA.

The dummy data line 171*d* in the dummy area MA may be omitted in some cases. In this case, the widths of the first and second initializing voltage supplying lines 1127 and 1128 and the reference voltage supplying line 1156 in the dummy area MA may be further widened (e.g., compared to when the dummy data line 171*d* is in the dummy area MA).

Hereinafter, a display device according to an embodiment will be described with reference to FIG. 14.

Figure 14:
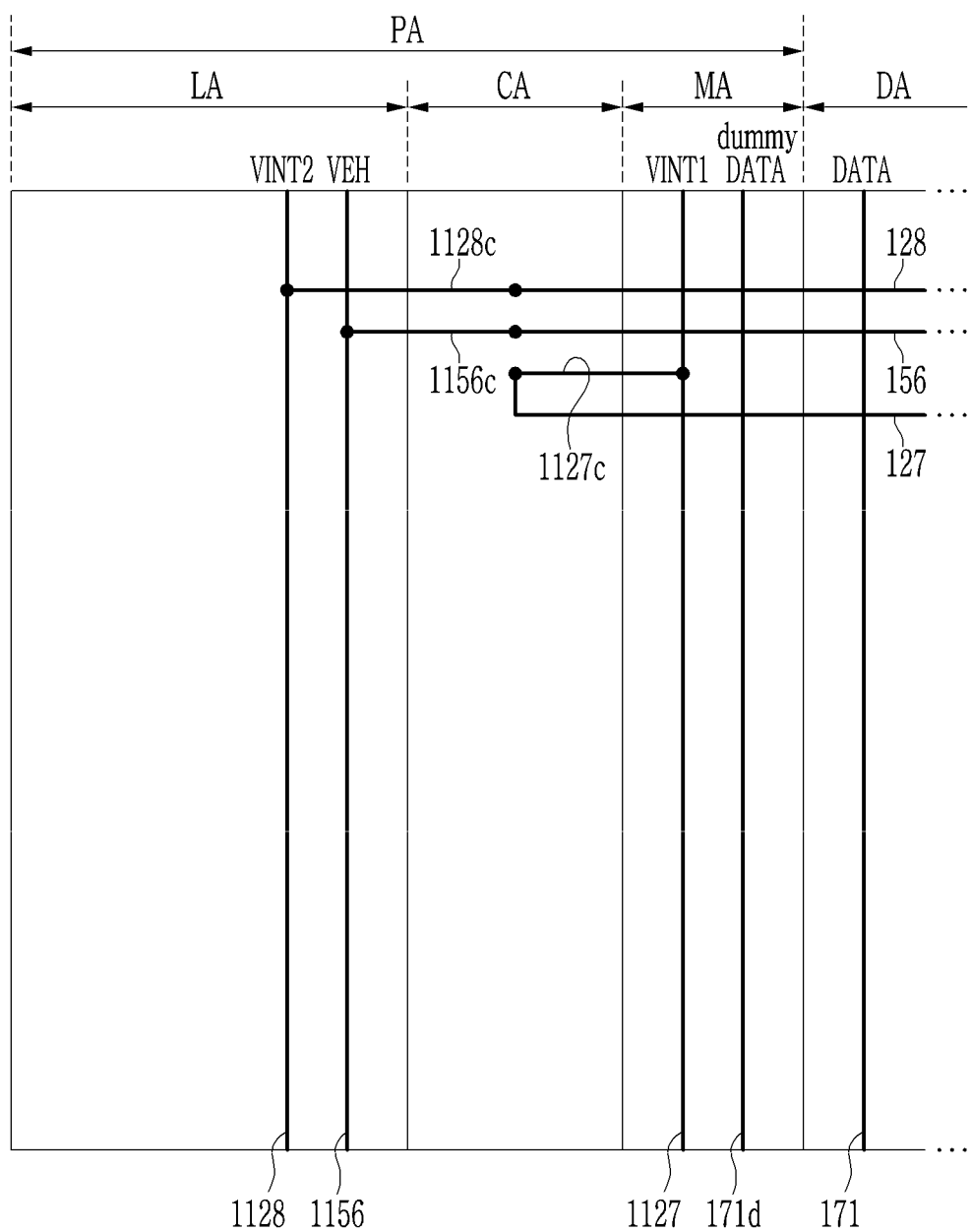
FIG. 14 is a diagram illustrating wires in a partial area of a display device according to an embodiment.

Because some portions (e.g., features) of the display device according to the embodiment of FIG. 14 are the same as those of the display device according to the embodiment of FIG. 1 to FIG. 7, a repeated description thereof may not be repeated. The present embodiment differs from the previous embodiment (e.g., the embodiment described with reference to FIG. 2) in that the first initializing voltage supplying line is in the dummy area, and the reference voltage supplying line is in the wire area, which will be further described below.

FIG. 14 is a diagram illustrating wires in a partial area of a display device according to an embodiment.

The display device according to the embodiment may include the display area DA and the peripheral area PA, and the peripheral area PA may include the dummy area MA, the connecting area CA, and the wire area LA.

The reference voltage line 156, the first initializing voltage line 127, and the second initializing voltage line 128 that extend in the row direction, and the data line 171 that extends in the column direction may be in the display area DA.

The first initializing voltage supplying line 1127 and the dummy data line 171*d* that extend in the column direction may be in the dummy area MA. In the above-described embodiment (e.g., the embodiment described with reference to FIG. 2), the first initializing voltage supplying line 1127 may be in the wire area LA, while in the present embodiment, the first initializing voltage supplying line 1127 may be in the dummy area MA. In addition, in the above-described embodiment (e.g., the embodiment described with reference to FIG. 2), the reference voltage supplying line 1156 is in the dummy area MA, while in the present embodiment, the reference voltage supplying line 1156 may be in the wire area LA.

The dummy data line 171*d* in the dummy area MA may be omitted in some cases. In this case, the width of the first initializing voltage supplying line 1127 in the dummy area MA may be further widened (e.g., compared to when the dummy data line 171*d* is in the dummy area MA).

Hereinafter, a display device according to an embodiment will be described with reference to FIG. 15.

Figure 15:
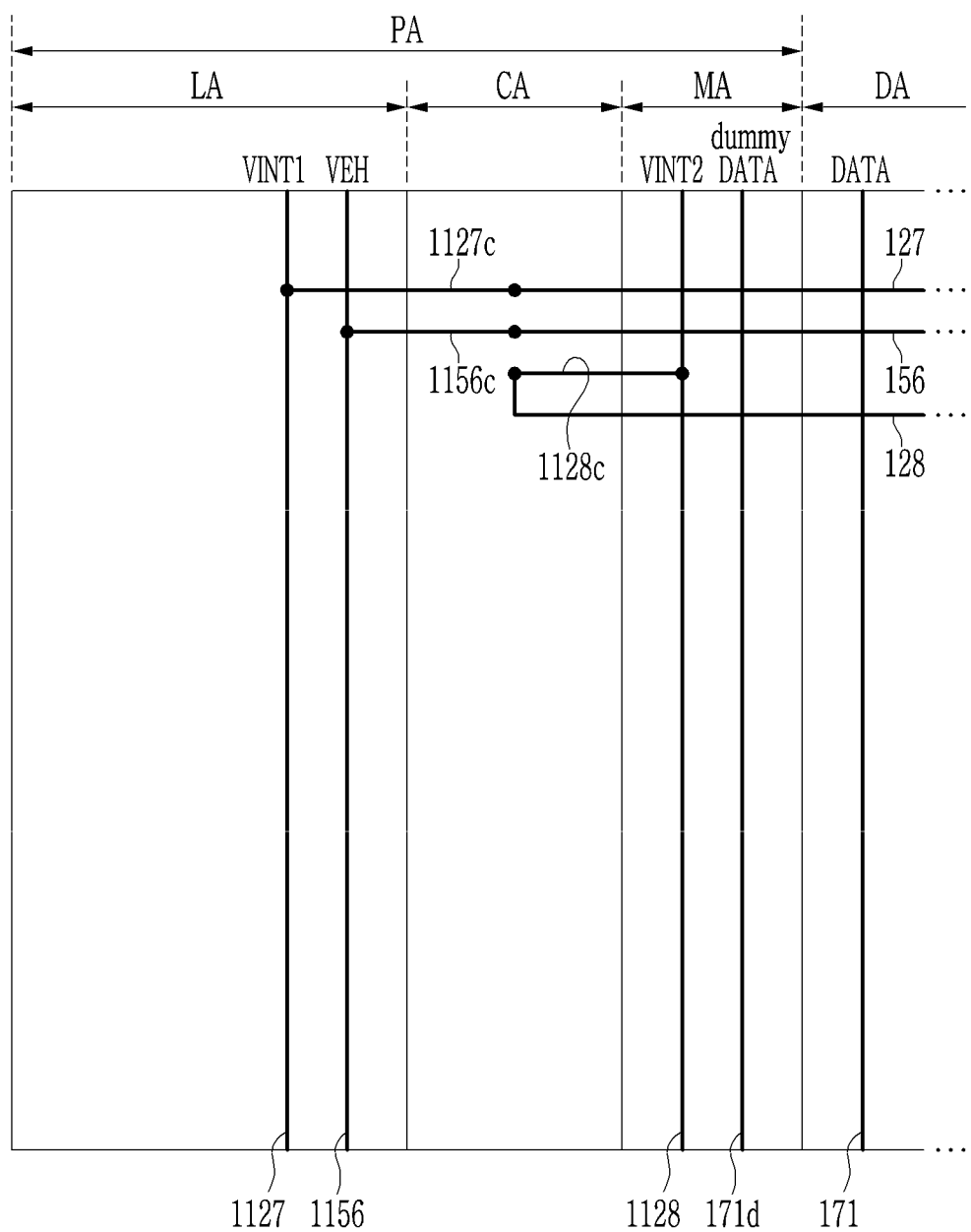
FIG. 15 is a diagram illustrating wires in a partial area of a display device according to an embodiment.

Because some portions (e.g., features) of the display device according to the embodiment of FIG. 15 are the same as those of the display device according to the embodiment of FIG. 1 to FIG. 7, a repeated description thereof may not be repeated. The present embodiment differs from the previous embodiment (e.g., the embodiment described with reference to FIG. 2) in that the second initializing voltage supplying line is in the dummy area and the reference voltage supplying line is in the wire area, which will be further described below.

FIG. 15 is a diagram illustrating wires in a partial area of a display device according to an embodiment.

The display device according to the embodiment may include the display area DA and the peripheral area PA, and the peripheral area PA may include the dummy area MA, the connecting area CA, and the wire area LA.

The reference voltage line 156, the first initializing voltage line 127, and the second initializing voltage line 128 that extend in the row direction may be in the display area DA, along with the data line 171 that extends in the column direction.

The second initializing voltage supplying line 1128 and the dummy data line 171*d* that extend in the column direction may be in the dummy area MA. In the above-described embodiment (e.g., the embodiment described with reference to FIG. 2), the second initializing voltage supplying line 1128 is in the wire area LA, while in the present embodiment, the second initializing voltage supplying line 1128 may be in the dummy area MA. In addition, in the above-described embodiment (e.g., the embodiment described with reference to FIG. 2), the reference voltage supplying line 1156 is in the dummy area MA, while in the present embodiment, the reference voltage supplying line 1156 may be in the wire area LA.

The dummy data line 171d in the dummy area MA may be omitted in some cases. In this case, the width of the second initializing voltage supplying line 1128 in the dummy area MA may be further widened (e.g., compared to when the dummy data line 171d is in the dummy area MA).

Hereinafter, a display device according to an embodiment will be described with reference to FIG. 16.

Figure 16:
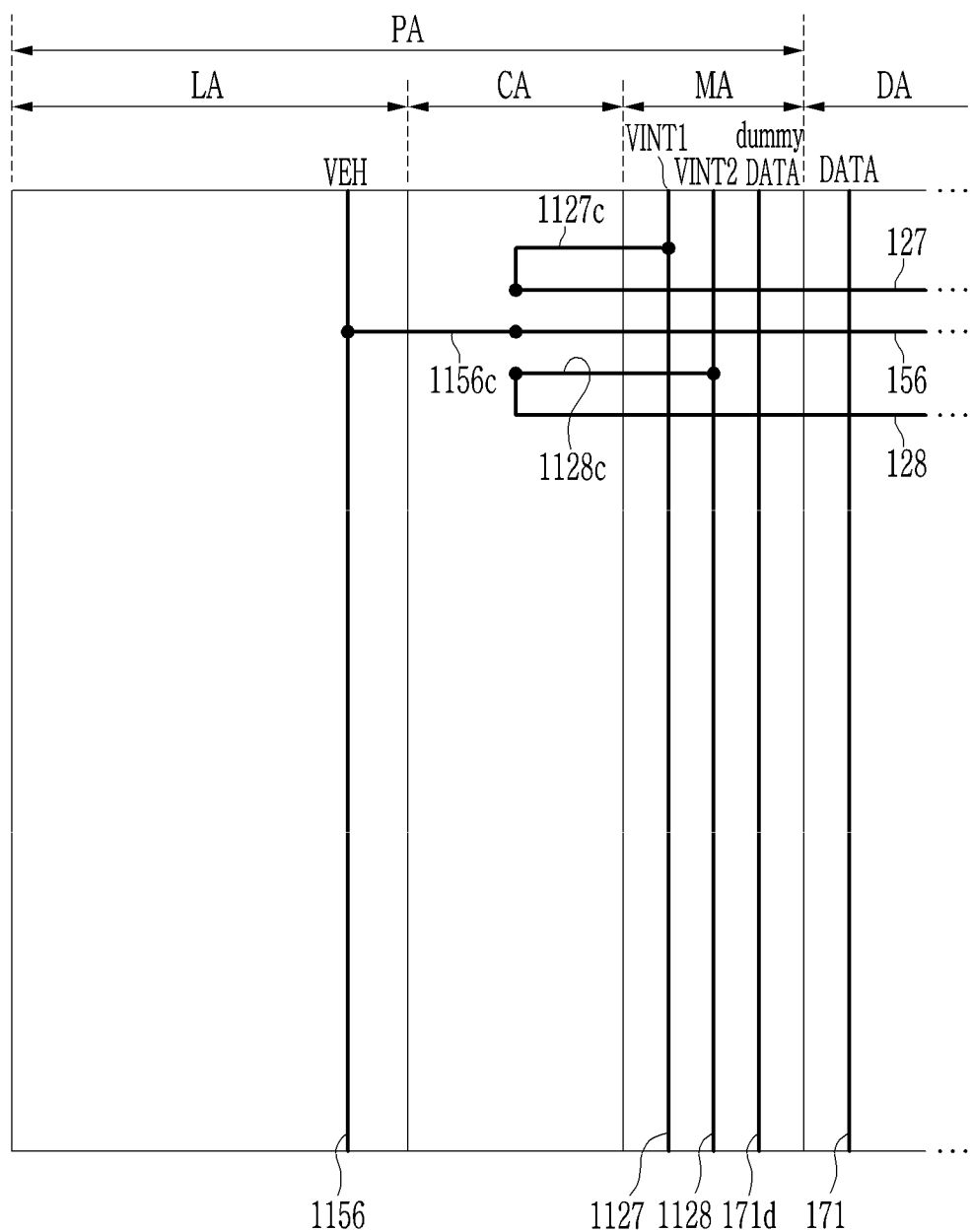
FIG. 16 is a diagram illustrating wires in a partial area of a display device according to an embodiment.

Because some portions (e.g., features) of the display device according to the embodiment of FIG. 16 are the same as those of the display device according to the embodiment of FIG. 1 to FIG. 7, a repeated description thereof may not be repeated. The present embodiment differs from the previous embodiment (e.g., the embodiment described with reference to FIG. 2) in that the first initializing voltage supplying line and the second initializing voltage supplying line are in the dummy area and the reference voltage supplying line is in the wire area, which will be further described below.

FIG. 16 is a diagram illustrating wires in a partial area of a display device according to an embodiment.

The display device according to the embodiment may include the display area DA and the peripheral area PA, and the peripheral area PA may include the dummy area MA, the connecting area CA, and the wire area LA.

The reference voltage line 156, the first initializing voltage line 127, and the second initializing voltage line 128 that extend in the row direction may be in the display area DA, along with the data line 171 that extends in the column direction.

The first initializing voltage supplying line 1127, the second initializing voltage supplying line 1128, and the dummy data line 171d that extend in the column direction may be in the dummy area MA. In the above embodiment (e.g., the embodiment described with reference to FIG. 2), the first initializing voltage supplying line 1127 and the second initializing voltage supplying line 1128 are in the wire area LA, while in the present embodiment, the first initializing voltage supplying line 1127 and the second initializing voltage supplying line 1128 may be in the dummy area MA. In addition, in the above-described embodiment (e.g., the embodiment described with reference to FIG. 2), the reference voltage supplying line 1156 is in the dummy area MA, while in the present embodiment, the reference voltage supplying line 1156 may be in the wire area LA.

The dummy data line 171d in the dummy area MA may be omitted in some cases. In this case, the widths of the first initializing voltage supplying line 1127 and the second initializing voltage supplying line 1128 in the dummy area MA may be further widened (e.g., compared to when the dummy data line 171d is in the dummy area MA).

According to the embodiments described above, at least one selected from among the reference voltage supplying line to which a constant DC voltage is applied, the first initializing voltage supplying line, and the second initializing voltage supplying line is in the dummy area, so that the luminance difference between pixels at the outermost portion of the display area and other pixels may be reduced, and the bezel may be reduced.

While this disclosure has been described in connection with the disclosed embodiments, it is to be understood that the present disclosure is not limited to the disclosed embodiments. The present disclosure is intended to cover various suitable modifications and equivalent arrangements included within the spirit and scope of the appended claims and equivalents thereof.

DESCRIPTION OF SYMBOLS

127: first initializing voltage line
128: second initializing voltage line
156: reference voltage line
171: data line
171d: dummy data line
1127: first initializing voltage supplying line
1127c: second protrusion
1128: second initializing voltage supplying line
1128c: third protrusion
1156: reference voltage supplying line
1156c: first protrusion

What is claimed is:

1. A display device, comprising:
a display area including a plurality of pixels;
a dummy area adjacent to an edge of the display area;
a reference voltage supplying line in the dummy area and to supply a reference voltage;
a wire area in which a wire to supply a signal to the display area is located;
a connecting area between the dummy area and the wire area; and
a reference voltage line coupled to the reference voltage supplying line in the connecting area,
wherein a pixel of the plurality of pixels includes:
a light emitting diode coupled between a driving voltage line to which a driving voltage is to be applied and a common voltage line to which a common voltage is to be applied, and
a driving transistor coupled between the driving voltage line and the light emitting diode, and
wherein the reference voltage is to be supplied to a first electrode of the driving transistor.

2. The display device of claim 1, further comprising:
an eighth transistor coupled to the first electrode of the driving transistor,
wherein the reference voltage line is coupled to a first electrode of the eighth transistor.

3. The display device of claim 1, wherein the reference voltage supplying line has a bar shape extending in a column direction.

4. The display device of claim 1, wherein the reference voltage supplying line extends in a column direction and is bent at least once.

5. The display device of claim 1, further comprising:
a data line in the display area; and
a dummy data line in the dummy area and adjacent to the data line.

6. The display device of claim 1, further comprising:
a first initializing voltage supplying line in the wire area and to supply a first initializing voltage,
a second initializing voltage supplying line in the wire area and to supply a second initializing voltage,
a fourth transistor coupled to a gate electrode of the driving transistor, and
a seventh transistor coupled to the light emitting diode,
wherein the first initializing voltage is to be supplied to a first electrode of the fourth transistor, and wherein the second initializing voltage is to be supplied to a second electrode of the seventh transistor.

7. The display device of claim 6, further comprising:
a first initializing voltage line coupled to the first electrode of the fourth transistor,
wherein the first initializing voltage line is coupled to the first initializing voltage supplying line.

8. The display device of claim 6, further comprising:
a second initializing voltage line coupled to the second electrode of the seventh transistor,
wherein the second initializing voltage line is coupled to the second initializing voltage supplying line.

9. The display device of claim 1, further comprising:
a first initializing voltage supplying line in the dummy area and to supply a first initializing voltage; and
a fourth transistor coupled to a gate electrode of the driving transistor,
wherein the first initializing voltage is to be supplied to a first electrode of the fourth transistor.

10. The display device of claim 9, further comprising:
a first initializing voltage line coupled to the first electrode of the fourth transistor,
wherein the first initializing voltage line is coupled to the first initializing voltage supplying line.

11. The display device of claim 9, further comprising:
a second initializing voltage supplying line in the dummy area and to supply a second initializing voltage; and
a seventh transistor coupled to the light emitting diode,
wherein the second initializing voltage is to be supplied to a second electrode of the seventh transistor.

12. The display device of claim 11, further comprising:
a second initializing voltage line coupled to the second electrode of the seventh transistor,
wherein the second initializing voltage line is coupled to the second initializing voltage supplying line.

13. The display device of claim 1, further comprising:
a second initializing voltage supplying line in the dummy area and to supply a second initializing voltage; and
a seventh transistor coupled to the light emitting diode,
wherein the second initializing voltage is to be supplied to a second electrode of the seventh transistor.

14. The display device of claim 13, further comprising:
a second initializing voltage line coupled to the second electrode of the seventh transistor,
wherein the second initializing voltage line is coupled to the second initializing voltage supplying line.

15. A display device, comprising:
a display area including a plurality of pixels;
a dummy area adjacent to an edge of the display area;
a first initializing voltage supplying line in the dummy area and to supply a first initializing voltage;
a wire area in which a wire to supply a signal to the display area is located;
a connecting area between the dummy area and the wire area; and
a first initializing voltage line coupled to the first initializing voltage supplying line in the connecting area,
wherein a pixel of the plurality of pixels includes:
a light emitting diode coupled between a driving voltage line to which a driving voltage is to be applied and a common voltage line to which a common voltage is to be applied,
a driving transistor coupled between the driving voltage line and the light emitting diode, and
a fourth transistor coupled to a gate electrode of the driving transistor, and
wherein the first initializing voltage is to be supplied to a first electrode of the fourth transistor.

16. The display device of claim 15, further comprising:
a second initializing voltage supplying line in the dummy area and to supply a second initializing voltage; and
a seventh transistor coupled to the light emitting diode,
wherein the second initializing voltage is to be supplied to a second electrode of the seventh transistor.

17. A display device, comprising:
a display area including a plurality of pixels;
a dummy area adjacent to an edge of the display area;
a second initializing voltage supplying line in the dummy area and to supply a second initializing voltage;
a wire area in which a wire to supply a signal to the display area is located;
a connecting area between the dummy area and the wire area; and
a second initializing voltage line coupled to the second initializing voltage supplying line in the connecting area,
wherein a pixel of the plurality of pixels includes:
a light emitting diode coupled between a driving voltage line to which a driving voltage is to be applied and a common voltage line to which a common voltage is to be applied,
a driving transistor coupled between the driving voltage line and the light emitting diode, and
a seventh transistor coupled to the light emitting diode, and
wherein the second initializing voltage is to be supplied to a second electrode of the seventh transistor.

18. The display device of claim 17, wherein further comprising:
the second initializing voltage line is coupled to the second electrode of the seventh transistor.

* * * * *